United States Patent [19]
Tanaka et al.

[11] Patent Number: 6,028,792
[45] Date of Patent: Feb. 22, 2000

[54] MULTI-LEVEL MEMORY FOR VERIFYING PROGRAMMING RESULTS

[75] Inventors: Tomoharu Tanaka, Yokohama; Ken Takeuchi, Tokyo, both of Japan

[73] Assignee: Kabushiki Kaisha Toshiba, Kawasaki, Japan

[21] Appl. No.: 09/015,611

[22] Filed: Jan. 29, 1998

[30] Foreign Application Priority Data

Jan. 31, 1997 [JP] Japan .................................. 9-018349

[51] Int. Cl.⁷ .................................................. G11C 16/06
[52] U.S. Cl. .............................. 365/185.22; 365/185.03; 365/185.24
[58] Field of Search ......................... 365/185.03, 185.18, 365/185.21, 185.22, 185.24, 185.28

[56] References Cited

U.S. PATENT DOCUMENTS

| | | | |
|---|---|---|---|
| 5,539,690 | 7/1996 | Talreja et al. ....................... | 365/185.22 |
| 5,596,526 | 1/1997 | Assar et al. ........................ | 365/185.17 |
| 5,757,699 | 5/1998 | Takeshima et al. ................ | 365/185.24 |
| 5,892,710 | 4/1999 | Fazio et al. ........................ | 365/185.03 |

OTHER PUBLICATIONS

Young–Joon Choi et al.; "A High Speed Programming Scheme For Multi–Level NAND Flash Memory" Jun. 13, 1996; pp. 170–171.

Tae–Sung Jung et al.; "A 117–mm² 3.3–V Only 128–Mb Multilayer NAND Flash Memory For Mass Storage Applications"; IEEE Journal of Solid State Circuits;. vol. 31. No. 11, Nov. 1996; pp. 1575–1583.

European Search Report; Application No. EP 98 10 1617; Apr. 29, 1999.

*Primary Examiner*—Son Mai
*Attorney, Agent, or Firm*—Banner & Witcoff, Ltd.

[57] ABSTRACT

A multi-level memory comprises an electrically programmable memory cell having at least an erased state, a first programming state and a second programming state, and a programming circuit for programming data by repeating a programming operation for a certain program by applying a programming voltage to the memory cell, a first programming verification operation for confirming whether or not the memory cell reached the first programming state after the programming operation, or a second programming verification operation for confirming whether or not the memory cell reached the second programming state after the programming operation, wherein the programming circuits repeat the programming operation and the first programming verification operation except for the second programming operation in the first period of the data programming, and repeats the programming operation, the first programming verification operation and the second programming verification operation in the second period after the first period of the data programming.

30 Claims, 22 Drawing Sheets

MULTI-LEVEL MEMORY FOR VERIFYING PROGRAMMING RESULTS

BACKGROUND OF THE INVENTION

The present invention relates to a multi-level memory, in particular, to a semiconductor memory device for storing a multi-level, such as a multi-level flash memory, a multi-level EEPROM, and a multi-level EPROM.

As a memory cell of the EEPROM, those having a MOSFET structure where a charge storage layer (floating gate) and a control gate are laminated and formed on a semiconductor substrate are known. In general, the memory cell stores data of one bit in one cell by storing a "0" or "1" according to the charge amount stored in the floating gate. In order to realize an EEPROM of a higher density, a multi-level memory method where data of multi bits are stored in one cell is known. For example, since data "0", "1", "2", "3" are stored in one cell in the four-level memory method, four charge amounts corresponding to the data are stored in the floating gate.

With an example of the four-level memory method, a configuration of the storage state of data will be explained.

With the floating gate charge amount of 0 defined to be the neutral state, a state where a positive charge with respect to the neutral state is defined to be the erasure state. The erasure state corresponds with the data "0". For example, by applying a high voltage (to 20 V) to a substrate with a control gate at 0 V, the erasure can be executed. A state where a negative charge amount with respect to the neutral state is defined to be the data "1" state. The data "2" state is also a state where a negative charge with respect to the neutral state is stored, but the negative charge amount is larger than the negative charge amount in the data "1" state. The data "3" state has further large negative charge amount.

For example, in the programming operation, with the substrate, source, drain having 0 V, and the control gate having a high voltage (to 20 V), a negative charge is stored in the floating gate so as to program the data "1", "2", "3". In the programming operation, with the substrate having 0 V, the source and drain having 10 V, and the control gate having a high voltage (to 20 V), a charge in the floating gate is retained so as to store the data "0", in the memory cell. Accordingly, four programming states ("0", "1", "2", "3") having threshold levels different from each other in the memory cell transistor can be realized in the memory cell.

As an example of a multi-level memory EEPROM, one where data of plural bits are programmed in a memory cell simultaneously as multi memory level data is known. In order to shorten the programming time, data of plural bits are programmed simultaneously. In this case, a plurality of data memory circuits are provided for programming multi-level data in the individual memory cells.

In order to accurately control the programming state, for example, the control data in the data memory circuit are converted such that the programming state of the memory cells is detected after the programming operation (programming verification), and if there is a memory cell with insufficient programming, a programming voltage is applied so as to promote programming only in the memory cell. By using the converted control data, the programming operation is executed again, and until all the selected memory cells are sufficiently programmed, the programming operation and the verification operation are executed.

However, the conventional multi-level memory EEPROM as mentioned above involves a problem due to the programming verification operation in addition to the time needed for actually storing a charge in a floating gate to prolong the total time necessary for programming. Particularly in the case whether each memory cell reached the programming state is detected independently, such as, first, whether the memory cell reached the "1" programming state is detected, and then whether the memory cell reached the "2" programming state is detected, the programming time will be extremely long by detecting all the programming state for each time. Besides, time needed for reaching the programming state for the memory cells differ from each other, that is, since the programming operation proceeds in order of "1", "2", "3", even when the easiest memory cell to program thereto reaches the "1" state, the other memory cells do not reach the "2" or "3" state, and thus it is totally meaningless to detect whether or not they reach the "2" or "3" state. That is, in the programming verifying operations, an unnecessary verifying operation is executed at the initial state of programming, thereby prolonging the programming time.

Since the control data are converted by executing the programming and verification, one data memory circuit has a plurality of sense circuits. In detecting a desired programming state with a plurality of sense circuits at the same time, sometimes a sense circuit detects that the programming is sufficient and another sense circuit detects that the programming is insufficient. This is due to the sensitivity difference caused by the irregularity of the transistor performance comprising the sense circuits. Therefore, sometimes the control data cannot be converted normally.

As heretofore mentioned, although the multi-level memory method is an effective means for achieving a high density, due to the difference in time necessary for each memory cell to reach the programming state, the programming time becomes too long since an unnecessary verify read is executed, thereby also prolonging the programming time for the programming verification. Further, by detecting the programming state of one memory cell with a plurality of sense circuits at the same time, the results may differ due to the sensitivity difference, thereby the reliability is ruined.

BRIEF SUMMARY OF THE INVENTION

An object of the present invention is to provide a multi-level memory capable of shortening the programming verification time.

Another object of the present invention is to provide a multi-level memory with high reliability, capable of providing stable programming verification results.

In a first aspect of the present invention, the below-mentioned configuration is adopted in order to solve the above-mentioned problems.

A first multi-level memory according to the first aspect of the present invention comprises an electrically programmable memory cell having at least an erased state, a first programming state and a second programming state, and a programming circuit for programming data by repeating a programming operation by applying a programming voltage to the memory cell, a first programming verification operation for confirming whether or not the memory cell reached the first programming state after the programming operation, or a second programming verification operation for confirming whether or not the memory cell reached the second programming state after the programming operation, wherein the programming circuit repeats the programming operation and the first programming verification operation except for the second programming operation in a first period of the data programming, and repeats the programming operation, the first programming verification operation and the second programming verification operation in a second period after the first period of the data programming.

Preferred implementations of the first multi-level memory of the first aspect of the present invention are as follows.

(1) The programming circuit repeats the programming operation and the second programming verification operation except for the first programming operation in a third period after the second period.

(2) The programming circuit changes the programming voltage to be applied to the memory cell when the memory cell is confirmed to have reached the predetermined programming state.

A second multi-level memory according to the first aspect of the present invention comprises a plurality of electrically programmable memory cells each having at least an erased state, a first programming state and a second programming state, and a programming circuit for programming data by repeating a programming operation by applying a programming voltage to the plurality of the memory cells at the same time, and at least one programming verification operation selected from the group consisting of a first programming a=verification operation for confirming whether or not the memory cell to be in the first programming state among the plurality of the memory cells has reached the first programming state after the programming operation and a second programming verification operation for confirming whether or not the memory cell to be in the second programming state among the plurality of the memory cells has reached the second programming state after the programming operation, wherein the programming circuit repeats the programming operation and the first programming verification operation except for the second programming operation in a first period of the data programming, and repeats the programming operation, the first programming verification operation and the second programming verification operation in a second period after the first period of the data programming.

Preferred implementations of the multi-level memory of the first aspect of the present invention are as follows.

(1) The programming circuit repeats the programming operation and the second programming verification operation except for the first programming operation in the third period after the second period.

(2) The programming circuit changes the programming voltage to be applied to the memory cell to be in the first programming state when the memory cell to be in the first programming state is confirmed to have reached the first programming state, and changes the programming voltage to be applied to the memory cell to be in the second programming state when the memory cell to be in the second programming state is confirmed to have reached the second programming state.

(3) The first period is preliminarily determined.

(4) The programming circuit repeats the programming operation and the second programming verification operation except for the first programming operation when all of the memory cells to be in the first programming state are confirmed to have reached the first programming state.

(5) The programming circuit simultaneously detects whether or not all of the memory cells to be in the first programming state have reached the first programming state.

(6) The programming circuit simultaneously detects whether or not all of the memory cells to be in the second programming state have reached the second programming state.

(7) The programming circuit applies an equal programming voltage to the memory cell to be in the first programming state and to the memory cell to be in the second programming state.

(8) The programming circuit completes the programming operation after confirming that all of the memory cells applied with programming have reached a desired programming state.

(9) The programming circuit simultaneously detects that all of the memory cells applied with programming have reached the desired programming state.

A multi-level memory according to the first aspect of the present invention executes the programming verification based on only the programming state where the programming verification to be executed after programming is necessary. That is, data "1", "2", "3" verify read is selected and executed. Since the time necessary for reaching the programming state for each memory cell differs, in consideration thereof, the verify read is executed only when it is necessary. Thereby, an unnecessary programming verification time can be omitted, and thus a multi-level memory programmable at a high speed can be realized.

A multi-level memory according to the second aspect of the present invention comprises a memory cell array comprising a plurality of nonvolatile memory cells each of which can store data of an n value ($n \geq 3$), and data memory circuits for storing control data for determining a programming control voltage to be applied to a selected memory cell in the memory cell array in a programming operation, wherein the data memory circuits apply the programming control voltage to the selected memory cell based on the control data stored in the data memory circuits, the data memory circuits storing first control data detect whether or not the selected memory cell reached the first state and when it has reached, the control data are changed to second control data, the data memory circuits storing the second control data detect whether or not the selected memory cell reached the second state and when it has reached, the control data are changed to third control data.

Preferred implementations of the multi-level memory of the second aspect of the present invention are as follows.

(1) The first state has a first threshold voltage level, and the second state has a second threshold level, which is lower than the first threshold voltage level.

(2) The data memory circuits comprise first sub-data circuits and second sub-data circuits, wherein the first sub-data circuits store sub-data of a first logic level and the second sub-data circuits store sub-data of a first logic level for storing the first control data, the first sub-data circuits store sub-data of a first logic level and the second sub-data circuits store sub-data of a second logic level for storing the second control data, and the first sub-data circuits store sub-data of the second logic level and the second sub-data circuits store sub-data of the second logic level for storing the third control data.

(3) The data memory circuits detect whether or not a programming state of the selected memory cell reached the first state by one of the first and second sub-data circuits, and whether or not the programming state of the selected memory cell reached the second state by the other one of the first and second sub-data circuits.

(4) A circuit for simultaneously detecting whether or not all the sub-data stored in the first and second sub-data circuits constituting all the data memory circuits are at the second logic level is further provided.

(5) The memory cell stores four-levels, and each of the first and second sub-data circuits includes a flip-flop circuit.

(6) The memory cell stores three-level, and each of the first and the second sub-data circuits includes a flip-flop circuit.

A multi-level memory according to the second aspect of the present invention executes the sense operation only with one sub-data circuit for detecting a programming state at the time of the programming verification to be executed after programming. Thereby, the programming verification result can be stable so that a multi-level memory with a high reliability can be realized.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Hereinafter embodiments of the present invention will be explained with reference to the accompanying drawings.

Figure 1:
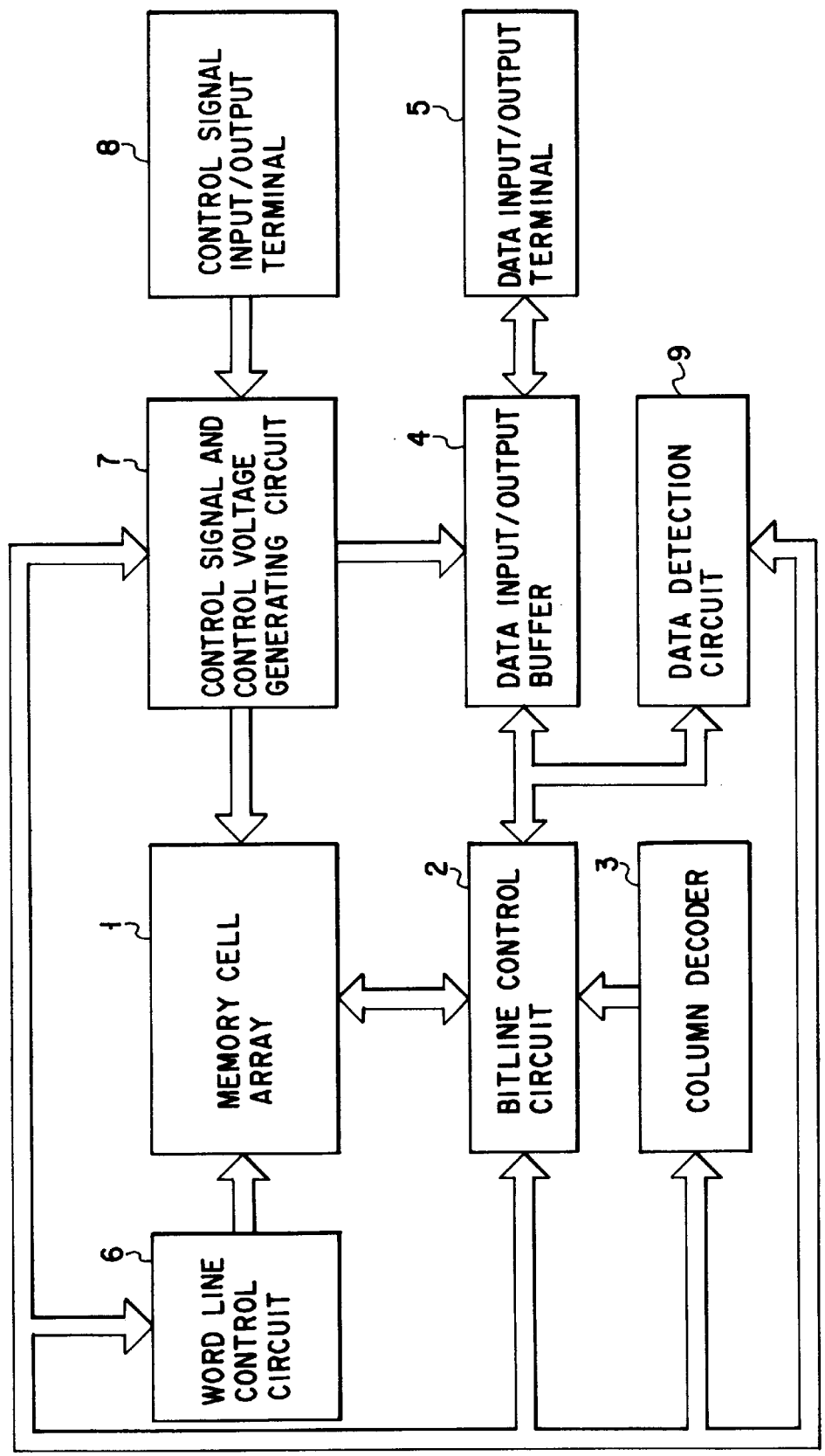
FIG. 1 is a block diagram showing a schematic configuration of a multi-level memory of the present invention.

FIG. 1 is a block diagram showing the schematic configuration of a multi-level memory of the present invention, specifically, a multi-level memory type NAND flash memory.

A memory cell array 1 comprises a plurality of memory cells where data can be electrically reprogrammed in a matrix manner. The memory cell array 1 includes a plurality of bitlines to be connected to each memory cell per row, and a plurality of word lines to be connected to each memory cell per column. A bitline control circuit 2 for controlling the bitlines, and a word line control circuit 6 are provided for the memory cell array 1.

The bitline control circuit 2 reads out data in the memory cells of the memory cell array 1 via the bitlines, detects the state of the memory cells in the memory cell array 1 via the bitlines, or programs the memory cells by applying a programming control voltage to the memory cells in the memory cell array 1 via the bitlines. The bitline control circuit 2 includes a plurality of data memory circuits. Data of the memory cells read out from a data memory circuit selected by a column decoder 3 are outputted to the outside from a data input/output terminal 5 via a data input/output buffer 4. Programming data inputted from the outside to the data input/output terminal 5 are inputted to a data memory circuit selected by the column decoder 3 as the initial control data via the data input/output buffer 4. In order to detect the contents stored in the plurality of data memory circuits included in the bitline control circuit 2, a data detection circuit 9 is provided.

The word line control circuit 6 selects a word line in the memory cell array 1, reads, programs, or applies a voltage necessary for erasure thereto.

The memory cell array 1, the bitline control circuit 2, the column decoder 3, the data input/output buffer 4, the word line control circuit 6, and the data detection circuit 9 are controlled by a control signal and control voltage generating circuit 7. The control signal and control voltage generating circuit 7 is controlled by a control signal inputted from the outside to a control signal input terminal 8. Further, it responds to the content of the plurality of data memory circuits included in the bitline control circuit 2 detected by the data detection circuit 9.

Figure 2:
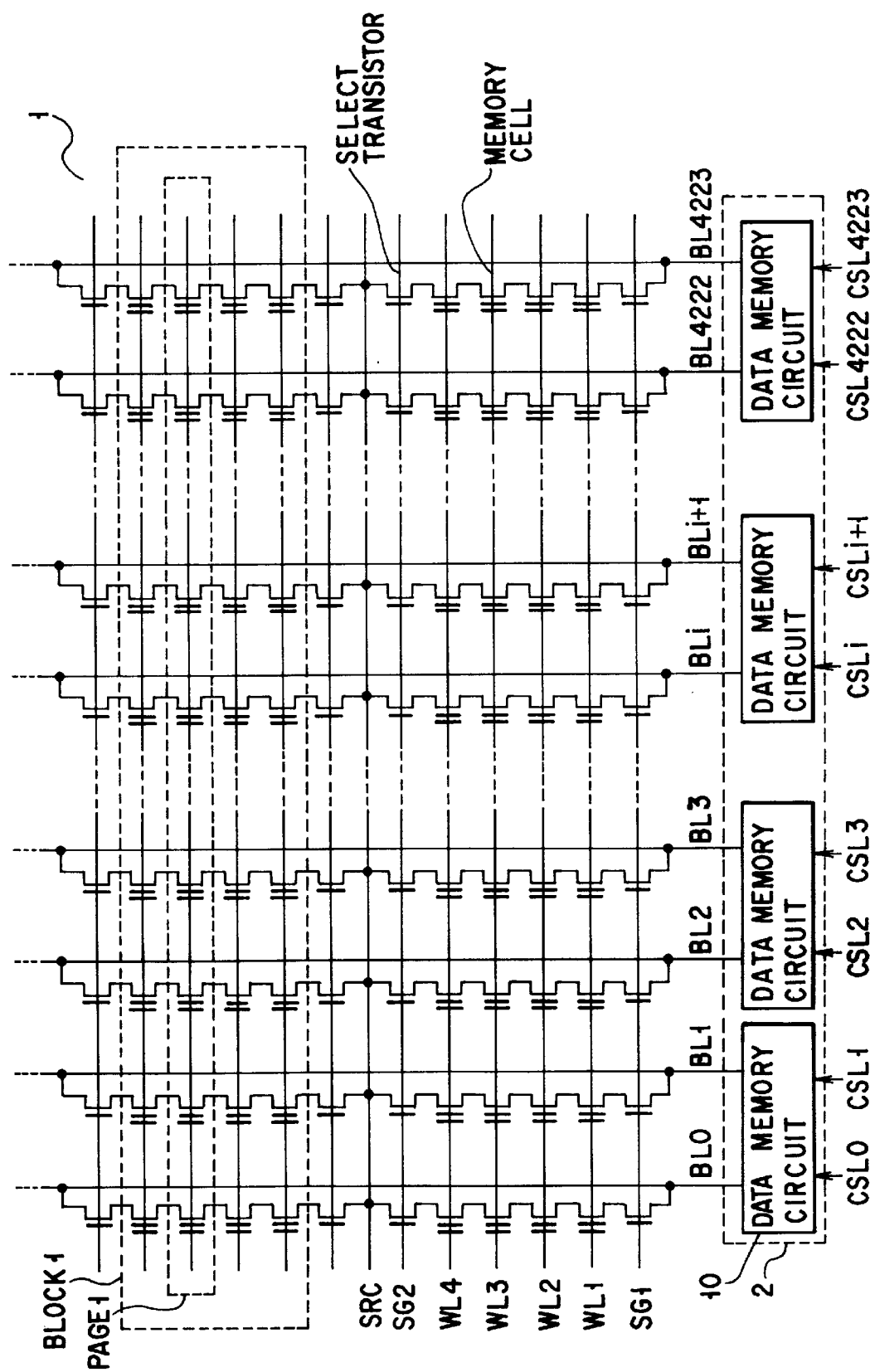
FIG. 2 is a circuit diagram showing a configuration of a memory cell array and a bitline control circuit of a first embodiment of the present invention shown in FIG. 1.

FIG. 2 shows a configuration of the memory cell array 1 and the bitline control circuit 2 shown in FIG. 1 of the first embodiment of the present invention.

One end of a NAND type cell unit where four memory cells M are serially connected is connected to a bitline BL via a select transistor S, and the other end is connected to a common source line SRC via a select transistor S. A control gate electrode of the memory cell M is connected to a word line WL. The two select transistors S are connected to select gates SG1 and SG2, respectively. The memory cells M sharing one word line WL form a unit referred to as a page. One block is formed with four pages. Here an example of two blocks is shown, but the number can be an optional integer, for example, 1024 blocks. 4224 bitlines of bitlines BL from BL0 to BL4223 are shown, but the number can be an optional integer, for example, 2112 bitlines.

The bitline control circuit 2 includes a plurality of data memory circuits 10. Here one data memory circuit 10 is provided for two bitlines BL, but the number can be an optional integer, for example, one can be provided for one, four, six, or nine bitlines. A signal CSL is an output signal from the column decoder 3. For example, data of the memory cells stored in the data memory circuit 10 connected to the bitlines BL0, BL1 are outputted to the data input/output buffer 4 by CSL0 and CSL1. For example, control data are transferred initially from the data input/output buffer 4 to the data memory circuit 10 connected to the bitlines BL2, BL3 by CSL2 and CSL3. The data memory circuit 10 reads the data of a memory cell connected to either one of the bitlines at the time of reading. Further, it applies a programming control signal according to the control data stored in a memory cell connected to either one of the bitlines at the time of programming. It detects the programming state of a memory cell connected to either one of the bitlines at the time of the programming state detection.

Figures 3A, 3B:
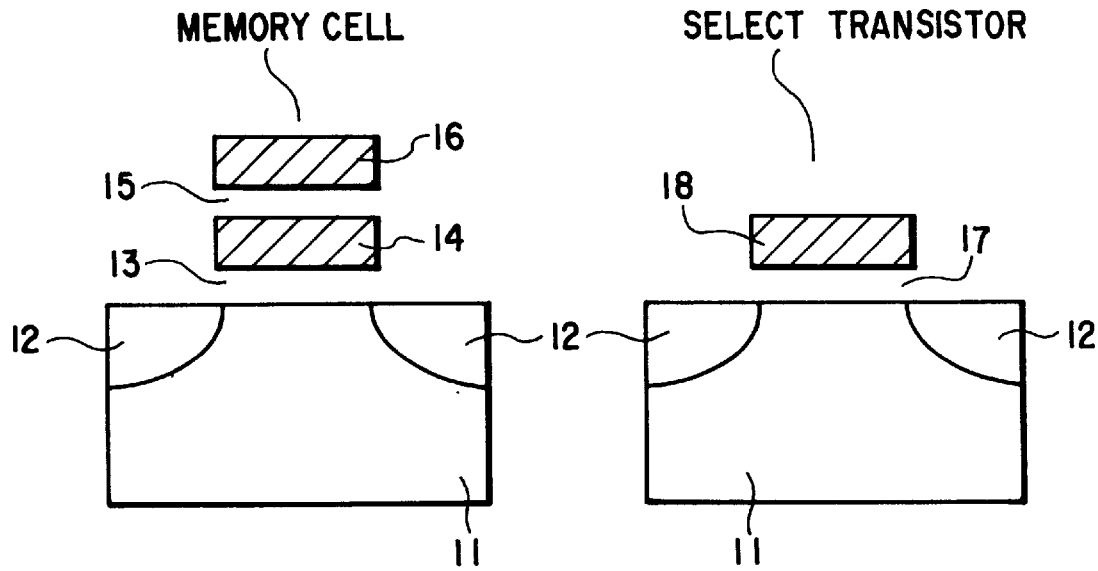
FIGS. 3A and 3B are cross-sectional views of the memory cell and a select transistor shown in FIG. 2.

FIGS. 3A and 3B are cross-sectional views of the memory cell M and the select transistor S respectively shown in FIG. 2. An n-type diffusion layer 12 is formed on the 1 surface of a p-type semiconductor substrate 11. In the memory cell M, a floating gate 14 is formed on the semiconductor substrate 11 via an insulation film 13, and a control gate 16 serving as a word line WL is formed thereon via an insulation film 15. In the select transistor S, a select gate 18 serving as a select gate SG is formed on a semiconductor substrate 11 via an insulation film 17.

Figure 4:
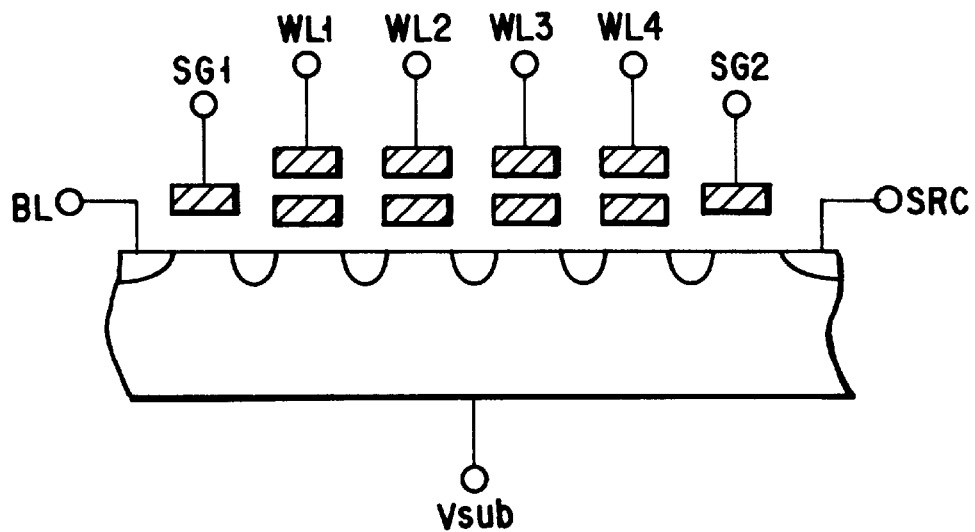
FIG. 4 is a cross-sectional view of a NAND type cell unit shown in FIG. 2.

FIG. 4 is a cross-sectional view of the NAND type cell unit shown in FIG. 2 with select transistors at both ends. Four memory cells M are serially connected with one end connected to a common source line SRC via a select transistor S. The other end is connected to a bitline BL via a select transistor S. At the time of programming, for example, 20 V is applied to a selected word line WL2. On the other hand, 10 V is applied to non-selected word lines WL1, WL3, and WL4. A power supply voltage VCC is applied to a select gate SG1. 0 V is applied to a select gate SG2.

In the case of a four-level memory device, in programming data "1", "2", "3", the bitline BL is set to 0 V. Accordingly, electrons are injected to a floating gate in the selected memory cell to have a positive threshold voltage. In programming data "0", the power supply voltage VCC is applied to the bitline BL. In this case, electrons are not injected to the floating gate. The bitline BL voltage in programming the data "1", "2", "3" may not be 0 V. For example, it is possible to set the voltage of the bitline BL for programming the data "1" at 0.8 V, and the bitline BL for programming the data "2", "3" at 0 V. This is because the electron amount to be injected to the floating gate of the memory cell M for storing the data "1" can be less than the electron amount to be injected for storing the data "2", "3". The voltage of the bitline BL for programming the data "1", "2", "3" can be different from each other. For example, they can be 0.8 V, 0.4 V, and 0 V, respectively.

At the time of erasure, the substrate voltage Vsub is set at 20 V. The select gates SG1 and SG2, the common source line SRC, and the bitline BL are also set at 20 V. With the word lines WL1 to WL4 of the block to be erased set at 0 V, electrons are discharged from the floating gate to have a negative threshold voltage (data "0" state). With the word lines WL1 to WL4 of a block not to be erased set at 20 V, electrons are not discharged from the floating gate.

In the case of a four-level memory, the threshold voltage of the memory cell corresponding to the data "0" is set at 0 V or less, the threshold voltage of the memory cell corresponding to the data "1" is set at 0.4 V to 0.8 V, the threshold voltage of the memory cell corresponding to the data "2" is set at 1.2 V to 1.6 V, and the threshold voltage of the memory cell corresponding to the data "3" is set at 2.0 V to 2.4 V. At the time of reading, the selected word line WL2 is set at Vread. The non-selected word lines WL1, WL3, and WL4 are set at the power supply voltage VCC (for example, 3.3 V). The select gates SG1 and SG are also set at VCC. The common source line SRC is set at 0 V.

(1) With Vread set at 0 V, if the selected memory cell stores the data "1", "2", or "3", the voltage of the bitline charged to VCC in the floating state remains at VCC. If the selected memory cell stores the data "0", the voltage of the bitline charged to VCC in the floating state lowers to 0 V.

(2) With Vread set at 1 V, if the selected memory cell stores the data "2", or "3", the voltage of the bitline charged to VCC in the floating state remains at VCC. If the selected memory cell stores the data "0" or "1", the voltage of the bitline charged to VCC in the floating state lowers to 0 V.

(3) With Vread set at 1.8 V, if the selected memory cell stores the data "3", the voltage of the bitline charged to VCC in the floating state remains at VCC. If the selected memory cell stores the data "0", "1", or "2", the voltage of the bitline charged to VCC in the floating state lowers to 0 V.

As the above-mentioned (1) to (3), by detecting the voltage of the bitline when the voltage Vread is changed, the data stored in the memory cell M can be judged.

Figure 5:
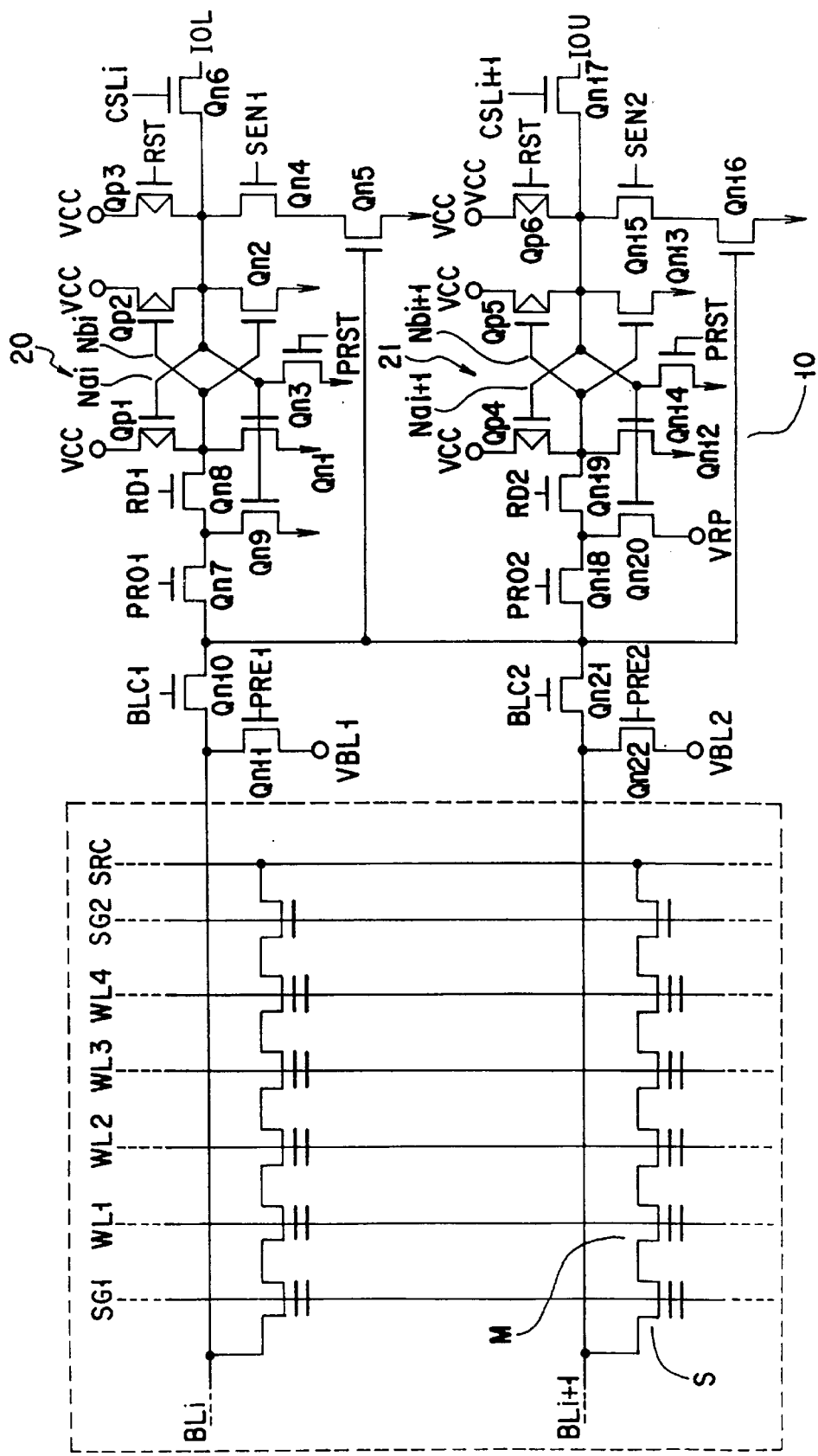
FIG. 5 is a circuit diagram for explaining a further concrete configuration of the memory cell array and a data memory circuit shown in FIG. 2.

FIG. 5 is for explaining a further concrete configuration of the memory cell array 1 and the data memory circuit 10 shown in FIG. 2. A partial circuit configuration is shown, paying attention to the bitline BLi and BLi+1. Here a configuration of a four-level memory flash memory is presented.

The data memory circuit 10 comprises first and second sub-data circuits 20 and 21, including a flip-flop circuit, respectively. Specifically, the first sub-data circuit 20 comprises p-channel MOS transistors Qp1 and Qp2, and n-channel MOS transistors Qn1, Qn2, Qn4, Qn5, and Qn8. The second sub-data circuit 21 comprises p-channel MOS transistors Qp4, and Qp5, and n-channel MOS transistors Qn12, Qn13, Qn15, Qn16, and Qn19. The first and second sub-data circuits 20 and 21 store first and second sub-data at the time of programming, and store first and second reading sub-data at the time of reading. P-channel MOS transistors Qp3 and Qp6 are for resetting the first and second sub-data circuits 20 and 21, respectively. When being reset, a node Nai in the first sub-data circuit 20 becomes "H" level. This is the state where the first sub-data circuit 20 stores the first reading sub-data of "1" or the first sub-data of "1". When being reset, a node Nai+1 in the second sub-data circuit 21 becomes "H" level. This is the state where the second sub-data circuit 21 stores the second reading sub-data of "1" or the second sub-data of "1". When the node Nai in the first sub-data circuit 20 is "L" level, this is the state where the first sub-data circuit 20 stores the first reading sub-data of "0" or the first sub-data of "0". When the node Nai+1 in the second sub-data circuit 21 is "L" level, this is the state where the second sub-data circuit 21 stores the second reading sub-data of "0" or the second sub-data of "0".

The n-channel MOS transistors Qn6 and Qn17 are for connecting the first and second sub-data circuits 20 and 21 with data input/output lines IOL and IOU electrically. To each gate electrode, the output CSLi and CSLi+1 from the column decoder 3 is applied. For example, with CSL1 at "H", the first sub-data circuit 20 of the data memory circuit 10 provided to the bitlines BLi and BLi+1 and the data input/output line IOL are electrically connected. The data input/output lines IOL and IOU are connected to the data input/output buffer 4 so that sub-data can be set in the first sub-data circuit 20. Or reading sub-data of the first sub-data circuit 20 can be outputted to the data input/output buffer 4. N-channel MOS transistors Qn3 and Qn14 are for presetting sub-data of "0" in the first and second sub-data circuits 20 and 21. When being preset, the node Nai in the first sub-data circuit 20 becomes "L" level. When being preset, the node Nai+1 in the second sub-data circuit 21 becomes "L" level.

N-channel MOS transistors Qn7 and Qn8 control the voltage of the bitline BLi or BLi+1 according to the first sub-data stored in the first sub-data circuit 20. N-channel MOS transistors Qn18 and Qn19 control the voltage of the bitline BLi or BLi+1 according to the second sub-data stored in the second sub-data circuit 21.

N-channel MOS transistors Qn7 and Qn9 set the voltage of the bitline BLi or BLi+1 at 0 V when the first sub-data of "1" are stored in the first sub-data circuit 20. N-channel MOS transistors Qn18 and Qn20 set the voltage of the bitline BLi or BLi+1 at 0 V when the second sub-data of "1" are stored in the second sub-data circuit 21.

N-channel MOS transistors Qn10 and Qn21 control the electric connection of the first and second sub-data circuits 20 and 21, and the bitline BLi or BLi+1. When the signal BLC1 is "H" and the signal BLC2 is "L", the first and second sub-data circuits 20 and 21, and the bitline BLi are electrically connected. When the signal BLC1 is "L" and the signal BLC2 is "H", the first and second sub-data circuits 20 and 21, and the bitline BLi+1 are electrically connected.

N-channel MOS transistors Qn11 and Qn22 control the electric connection of the bitline BLi and the voltage VBL1, and the electric connection of the bitline BLi+1 and the voltage VBL2. When the signal PRE1 is "H", the bitline BL1 and the voltage VBL1 are electrically connected. When the signal PRE2 is "H", the bitline BLi+1 and the voltage VBL2 are electrically connected.

Signals RST, SEN1, RD1, RD2, PRO1, PRO2, PRST, BLC1, BLC2, PRE1, PRE2, voltages VRP, VBL1, VBL2 are output signals of the control signal and control voltage generating circuit 7, which are common to all of the data memory circuits 10 shown in FIG. 2. The data input/output lines IOL and IOU are connected to the data input/output buffer 4, which are common to all of the data memory circuits 10 shown in FIG. 2. The voltage VCC is a power supply voltage, and is, for example, 3.3 V.

The first and second sub-data circuits 20 and 21 store sub-data of "0" or "1". On the other hand, each of them changes the stored sub-data of "1" responding to the "H" level of the bitline signal to sub-data of "0" as a sense circuit, and stores the sub-data of "0". The first and second sub-data circuits 20 and 21 store reading sub-data of "0" or "1", and each of them changes the stored reading sub-data of "1" responding to the "H" level of the bitline signal to reading sub-data of "0", and stores the sub-data of "0".

When the signal SEN1 or SEN2 shown in FIG. 5 becomes "H" with the "H" level of the bitline BL transferred to the gate electrode of the n-channel MOS transistor Qn5 or Qn16, the n-channel MOS transistor Qn5 or Qn16 is executed and the node Nai or Nai+1 becomes the "L" level. Accordingly, the sub-data or reading sub-data of "1" are changed to the sub-data or reading sub-data of "0". Since the sub-data or reading sub-data of "0" have the node Nai or Nai+1 of the "L" level, they are not changed. Further, the sub-data or reading sub-data are not changed by the "L" level of the bitline BL since the n-channel MOS transistor Qn5 or Qn16 is not executed. The first and second sub-data circuits can be realized not only in the configuration shown in FIG. 5 but also in various circuits having the above-mentioned functions.

Figure 6:
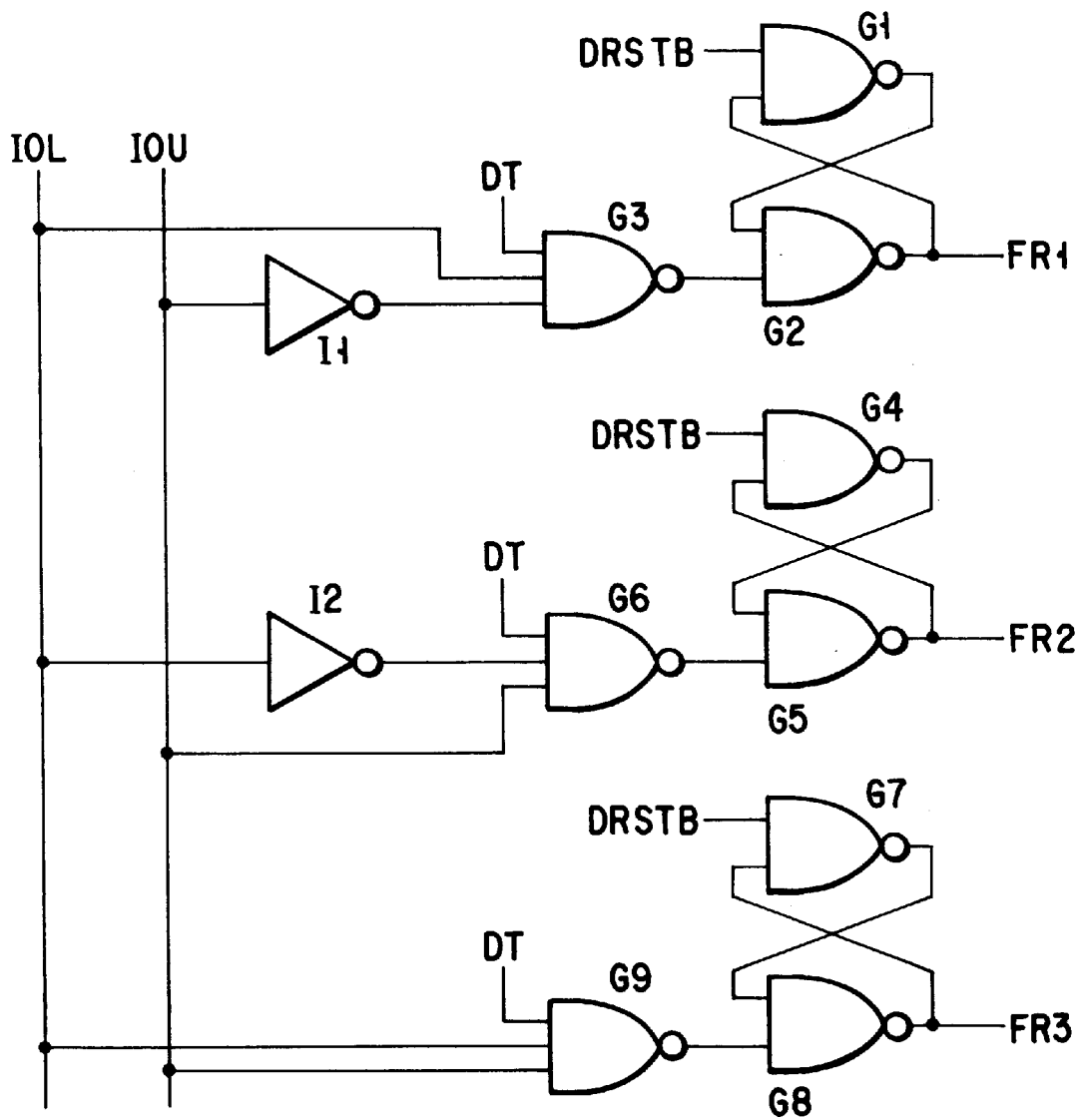
FIG. 6 is a diagram showing a configuration of a data detection circuit shown in FIG. 1.

FIG. 6 shows a concrete configuration of the data detection circuit 9 shown in FIG. 1. A circuit comprising an inverter I1, and NAND logic circuits G1, G2, G3, detects whether or not control data of "1" exist in the data memory circuits 10. If even one of the data memory circuits 10 has control data of "1", the signal FR1 becomes "H". A circuit comprising an inverter I2, and NAND logic circuits G4, G5, G6, detected whether or not control data of "2" exist in the data memory circuits 10. If even one of the data memory circuits 10 has control data of "2", the signal FR2 becomes "H". A circuit comprising an inverter I3, and NAND logic circuits G7, G8, G9, detects whether or not control data of "3" exist in the data memory circuits 10. If even one of the data memory circuits 10 has control data of "1", the signal FR3 becomes "H". When the signal DT is "H", the control data of the data memory circuits 10 are detected via the data input/output lines IOL and IOU. When the signal DRSTB becomes "L", the signals FR1, FR2, and FR3 are reset to be "L". The signals DT and DRSTB are output signals of the control signal and control voltage generating circuit 7. The signals FR1, FR2, and FR3 are fed back to the control signal and control voltage generating circuit 7.

Figure 7:
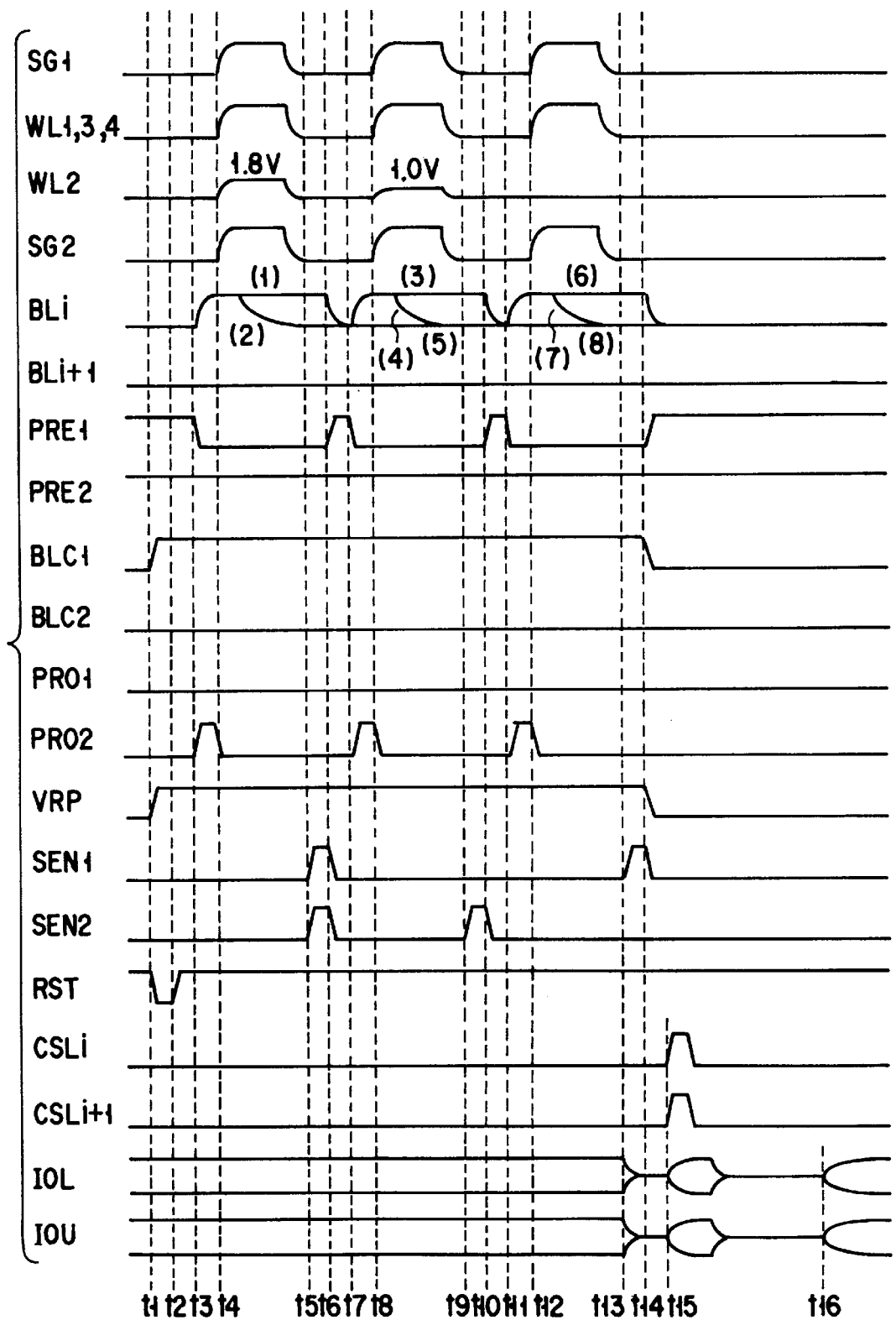
FIG. 7 is a timing chart showing the reading operation of a four-level data stored in the memory cell in the first embodiment of the present invention.

FIG. 7 shows the reading operation of four-level data stored in a memory cell. Here, an example where bitlines BL0, BL2, . . . , BLi, . . . , BL4222 are selected (BLi is shown as the representative thereof), and the word line WL2 is selected is shown. If the memory level is defined to be three levels, three-level memory can be realized readily. The voltages VBL1, VBL2 are 0 V during the reading operation.

The signal BCL1 becomes "H" so that the bitline BLi is selected (t1). By the signal RST, the first and second reading sub-data of "1" are set in the first and second sub-data circuits 20 and 21, respectively (t1 to t2). The voltage VRP becomes the power supply voltage VCC (t1).

The signal PRE1 becomes "L" so that the bitline BLi and the voltage VBL1 are disconnected (t3). The signal PRO2 becomes "H" (t3), and the bitline BLi is charged to the "H" level by the second sub-data circuit 21 (t3 to t4). Then, the select gates SG1 and SG2 of the selected block and the non-selected word lines WL1, WL3, WL4 are set to be the power supply voltage VCC so that the selected word line WL2 becomes 1.8 V (t4). The relationship between the data stored in the memory cell M and the thresholds are shown in Table 1.

TABLE 1

| Data of memory cell | Threshold voltage of the memory cell |
|---|---|
| 0 | 0 V or less |
| 1 | 0.4 V–0.8 V |
| 2 | 1.2 V–1.6 V |
| 3 | 2.0 V–2.4 V |

With the selected word line WL2 at 1.8 V, only when the memory cell stores the data of "3", the bitline BLi remains at "H" (FIG. 7(1)). In the other cases, the bitline BLi becomes "L" (FIG. 7(2)). Then with the signals SEN1 and SEN2 at "H", the voltage of the modulated bitline BLi is sensed and read out (t5 to t6). Only in the case the memory cell stores the data of "3", the first and second reading sub-data of the first and second sub-data circuits 20 and 21 become "0". In the other cases, the first and second reading sub-data remain "1".

The signal PRE1 becomes "H" (t6 to t7) so that the bitline BLi is reset at 0 V. Then the signal PRO2 becomes "H" (t7 to t8) so that only when the second reading sub-data are "1", the bitline BLi is charged to the "H" level by the voltage VRP (t7 to t8). The bitline BLi remains at the "L" level when the second reading sub-data stored in the second sub-data circuit 21 are "0" 1 (FIG. 7(5)). The select gates SG1 and SG2 of the selected block and the non-selected word lines WL1, WL3, WL4 are set at the power supply voltage VCC so that the selected word line WL2 is set at 1.0 V (t8).

With the selected word line WL2 at 1.0 V, only when the memory cell stores the data of "2", the bitline BLi remains at "H" (FIG. 7(3)). In the case the memory cell stores the data of "1" or "0", the bitline BLi becomes "L" (FIG. 7(4)). Then with the signal SEN2 at "H", the voltage of the modulated bitline BLi is sensed and read out (t9 to t10). Only in the case the memory cell stores the data of "2", the second reading sub-data change from "1" to "0". In the case the memory cell stores the data of "1" or "0", the second reading sub-data remains "1". In the case the memory cell stores the data of "3", the second reading sub-data is already "0".

The signal PRE1 becomes "H" (t10 to t11) so that the bitline BLi is reset at 0 V. Then the signal PRO2 becomes "H" (t11 to t12) so that only when the second reading sub-data are "1", the bitline BLi is charged to the "H" level by the voltage VRP (t11 to t12). The bitline BLi remains at the "L" level when the second reading sub-data stored in the second sub-data circuit 21 are "0" (FIG. 7(8)). The select gates SG1 and SG2 of the selected block and the non-selected word lines WL1, WL3, WL4 are set at the power supply voltage VCC so that the selected word line WL2 is set at 1.0 V (t12).

With the selected word line WL2 at 1.0 V, only when the memory cell stores the data of "1", the bitline BLi remains at "H" (FIG. 7(6)). In the case the memory cell stores the data of "0", the bitline BLi becomes "L" (FIG. 7(7)). Then with the signal SEN1 at "H", the voltage of the modulated bitline BLi is sensed and read out (t13 to t14). Only in the case the memory cell stores the data of "1", the second reading sub-data change from "1" to "0". In the case the memory cell stores the data of "0", the first reading sub-data remains "1". In the case the memory cell stores the data of "3", the first reading sub-data is already "0". In the case the memory cell stores the data of "2", since the voltage of the bitline BLi is "L" regardless of the memory cell, the first reading sub-data remains "1".

With the signals CSLi and CSLi+1 at "H", the first reading sub-data are outputted to the data input/output line IOL so as to be outputted to the outside from the data input/output line IOU via the data output buffer 4. The second reading sub-data are outputted to the data input/output line IOL so as to be outputted to the outside from the data input/output line IOU via the data output buffer 4. According to the signal CSL selected by the column decoder 3, first and second reading sub-data of an optional column address can be outputted.

During the reading operation, the non-selected bitline BLi+1 is fixed at the voltage VBL2. Herein it is 0 V.

The relationship between the four-level data of the memory cell and the first and second reading sub-data are shown in Table 2.

TABLE 2

| Data of memory cell | First reading sub-data | Second reading sub-data |
|---|---|---|
| 0 | 1 | 1 |
| 1 | 0 | 1 |
| 2 | 1 | 0 |
| 3 | 0 | 0 |

Figure 8:
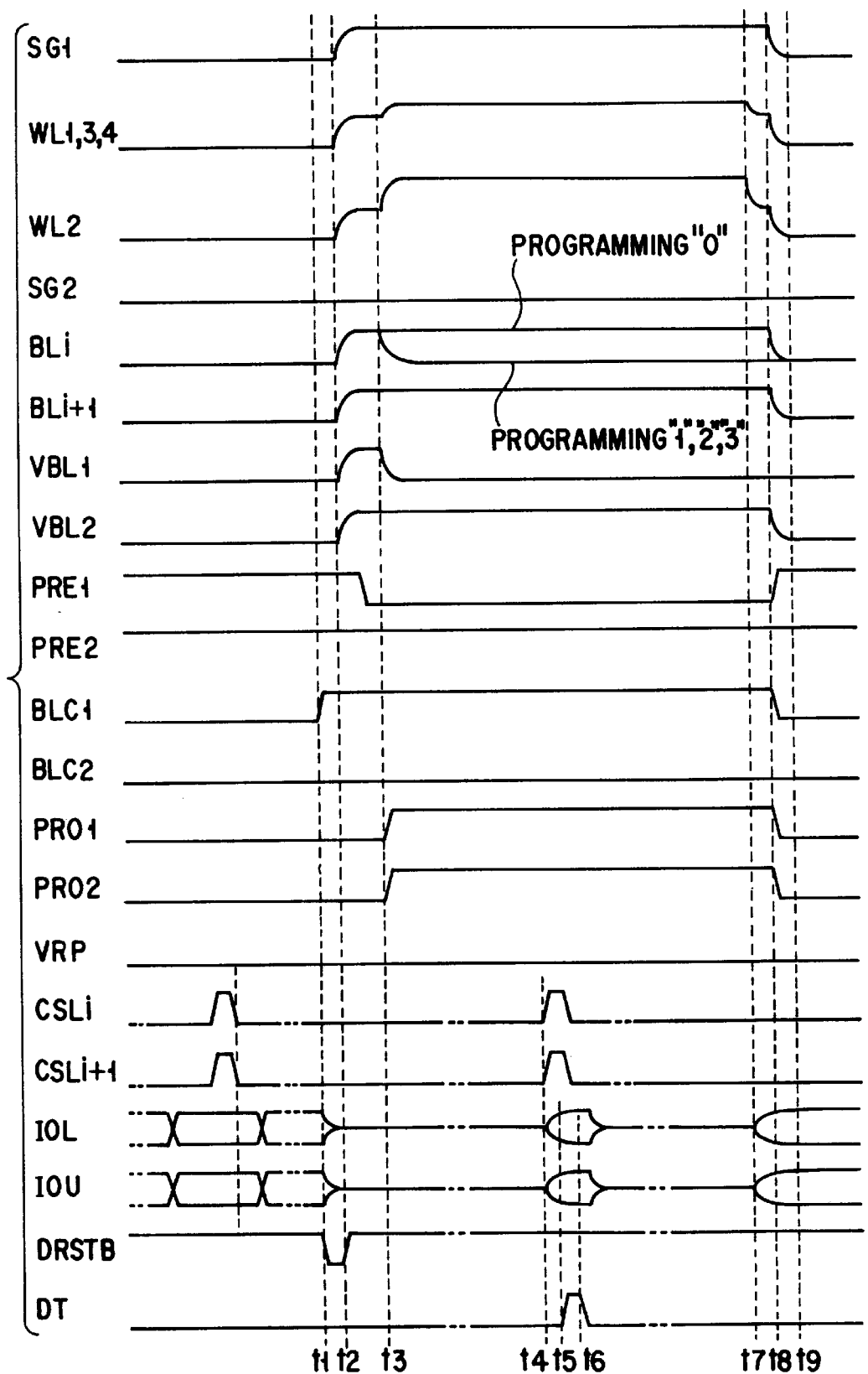
FIG. 8 is a timing chart showing the initial setting of control data to the data memory circuit and the programming operation in the first embodiment of the present invention.

FIG. 8 shows the initial setting of the control data and the programming operation to the data memory circuit 10. Here, an example where bitlines BL0, BL2, . . . , BLi, . . . , BL4222 are selected (BLi is shown as the representative thereof), and the word line WL2 is selected is shown. If the memory level is defined to be three levels, three-level memory can be realized readily.

The initial setting of the control data to the data memory circuit 10 comprising the bitline BLi can be executed as mentioned below. With the initial sub-data of the first sub-data circuit 20 being transferred to the data input/output line IOL and the signal CSL1 becomes "H", the initial sub-data are stored in the first sub-data circuit 20. At the same time, with the initial sub-data of the second sub-data circuit 21 transferred to the data input/output line IOU and the signal CSLi+1 become "H", the initial sub-data are stored in the second sub-data circuit 21. The relationship between the initial control data and the initial sub-data are shown in Table 3.

TABLE 3

| Initial control data | Initial sub-data of the first sub-data circuit | Initial sub-data of the second sub-data circuit |
|---|---|---|
| 0 | 0 | 0 |
| 1 | 1 | 0 |
| 2 | 0 | 1 |
| 3 | 1 | 1 |

Here, it is preferable to set the signal PRST at "H" so that the control data of all the data memory circuits 10 are preset at "0" before setting all the initial control data. As later described, since the state of the memory cell cannot be changed by the control data "0", the initial control can be set from the outside only to desired data memory circuits 10 among the 2112 pieces of the data memory circuits 10. Of course the initial control data can be set from the outside to all the 2112 pieces of the data memory circuits 10.

In the programming operation, the signal BLC1 becomes "H" so that the bitline BLi is selected (t1). With the signal DRSTB becoming "L", the data detection circuit 9 is reset (t1 to t2). With the voltage VBL1 at VCC, the selected bitline BLi is charged to the VCC via the n-channel MOS transistor Qn11. Then with the signal PRE1 at "L", the select bitline BLi becomes floating (t2 to t3). With the voltage VBL2 at VCC, the selected bitline BLi+1 is charged to VCC via the n-channel MOS transistor Qn22 (t2 to t3). Further, the select gate SG1 and the word lines WL1 to WL4 become VCC (t2 to t3).

When the signals PRO1 and PRO2 are "H" and either one of the first and second sub-data is "1", the select bitline BLi is set at 0 V by the n-channel MOS transistor Qn9 or Qn20 (t3). As a result, the bitline BLi becomes VCC when the control data are "0", and becomes 0 V when the control data are "1", "2", or "3". With the selected word line WL2 at 20 V, the non-selected word line at 10 V, electron injection from the memory cell to the floating gate is started according to the control data (t3). When the bitline BL is at VCC, since the potential difference between the channel of the memory cell and the word line is small, electron injection does not occur substantially.

While the selected word line WL2 is set at 20 V (t3 to t7), the control data stored in the data memory circuit 10 are detected. From CSL0 and CSL1 to CSL4222 and CSL4223 are selected successively by the column decoder. The control data are transferred to the data detection circuit 9 via the input/output lines IOL and IOU. An example of the case where CSLi and CSLi+1 are selected is shown in FIG. 8. With CSLi and CSLi+1 at "H" (t4 to t5), the control data outputted to the data input/output lines IOL and IOU, and the signal DT at "H", the control data are detected by the data detection circuit 9 (t5 to t6). If even one of the data memory circuits 10 stores the data "1", the signal FR1 becomes "H". If even one of the data memory circuits 10 stores the data "2", the signal FR2 becomes "H". If even one of the data memory circuits 10 stores the data "3", the signal FR3 becomes "H".

After the word lines WL1 to WL4 are dropped to VCC (t7 to t8), the voltage VBL2 becomes 0 V, and the signal PRE1 becomes "H" so that the bitlines BLi, BLi+1 are reset at 0 V (t8 to t9). The voltage VBL1 is 0 V. The word lines WL1 to WL4 are also reset at 0 V (t8 to t9).

Figure 9:
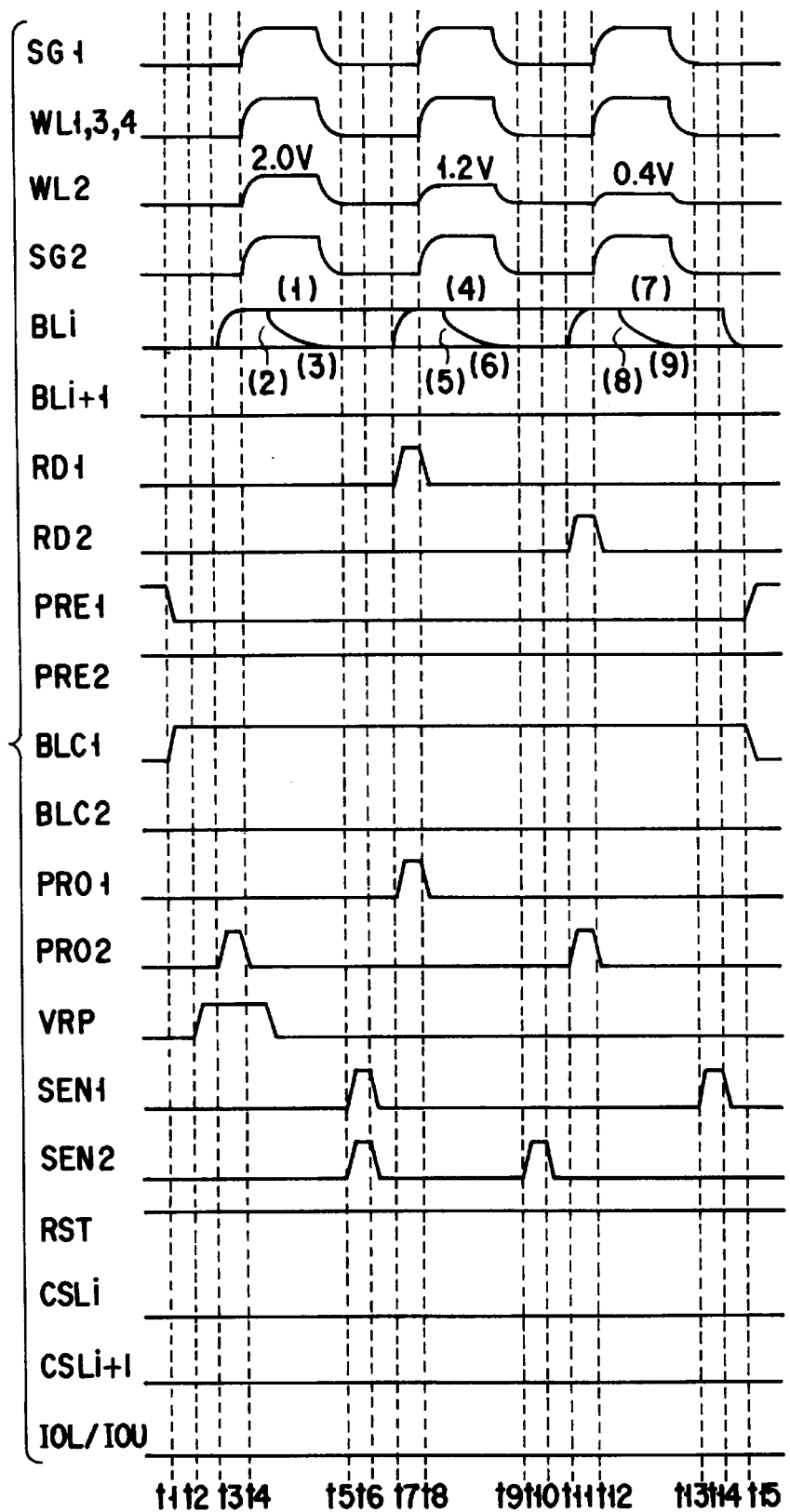
FIG. 9 is a timing chart showing the programming verification operation in the first embodiment of the present invention.

FIG. 9 shows the programming verification operation for detecting the programming state of the memory cell after the programming operation is done in the time t1 to t9 shown in FIG. 8. Here, an example where bitlines BL0, BL2, . . . , BLi, . . . , BL4222 are selected (BLi is shown as the representative thereof), and the word line WL2 is selected is shown. The voltages VBL1 and VBL2 are 0 V. If the memory level is defined to be three levels, three-level memory can be realized readily.

The signal PRE1 becomes "L" so that the bitline BLi and the voltage VBL1 are disconnected, and the bitline BLi is in the floating state of 0 V (t1). At the same time, the signal BLC1 becomes "H" so that the bitline BLi is selected (t1).

With the voltage VRP at the power supply voltage VCC (t2), and the signal PRO2 at "H" (t3), the bitline BLi corresponding to the data memory circuit 10 storing the control data of "3" and "2" is charged to the "H" level by the n-channel MOS transistor Qn20 (t3 to t4). The bitline BLi corresponding to the data memory circuit 10 storing the control data of "1" and "0" remains at the "L" level. The select gates SG1 and SG2 of the selected block and the non-selected word lines WL1, WL2, WL4 are set at the power supply voltage VCC and the selected word line WL2 is set at 2.0 V (t4). With the selected word line WL2 at 2.0 V, if the memory cell corresponding to the data memory circuit 10 storing the control data of "3" reaches the state of storing the "3" data, the bitline BLi remains at "H" (FIG. 9(1)). With the selected word line WL2 at 2.0 V, if the memory cell corresponding to the data memory circuit 10 storing the control data of "3" does not reach the state of storing the "3" data, the bitline BLi becomes "L" (FIG. 9(2)). Since the memory cell corresponding to the data memory circuit 10 storing the control data of "2" does not reach the state of storing the "3" data, the bitline BLi becomes "L" (FIG. 9(3)). Then with the signals SEN1 and SEN2 at "H", the voltage of the modulated bitline BLi is sensed and read out (t5 to t6). Only when the memory cell corresponding to the data memory circuit 10 storing the "3" control data reaches the state of storing the "3" data, the first and second sub-data of the first and second sub-data circuits 20 and 21 become "0" to change the control data to "0". In other cases, the first and second sub-data are retained. Time from t2 to t6 is the verify read of the data "3".

With the signals PRO1 and RD1 at "H" (t7), the bitline BLi corresponding to the data memory circuit 10 storing the control data of "2" and "0" is charged to the "H" level by the first sub-data circuit 20 (t7 to t8). The bitline BLi corresponding to the data memory circuit 10 storing the control data of "3" and "1" is set at the "L" level by the first sub-data circuit 20 (t7 to t8).

Then the select gates SG1 and SG2 of the selected block, and the non-selected word lines WL1, WL3, WL4 are set at the power supply voltage VCC, and the selected word line WL2 is set at 1.2 V (t8). With the selected word line WL2 at 1.2 V, if the memory cell corresponding to the data memory circuit 10 storing the "2" data reaches the state of storing the "2" data, the bitline BLi remains at "H" (FIG. 9(4)). If the memory cell corresponding to the data memory circuit 10 storing the control data of "2" does not reach the state of storing the "2" data, the bitline BLi becomes "L" (FIG. 9(5)). If the memory cell corresponding to the data memory circuit 10 storing the "0" data does not reach the state of storing the "2" or "3" data, the bitline BLi remains at "H" (FIG. 9(4)). If the memory cell corresponding to the data memory circuit 10 storing the control data of "0" does not reach the state of storing the "2" data, the bitline BLi becomes "L" (FIG. 9(5)). The memory cell corresponding to the data memory circuit 10 storing the control data of "3" and "1" remains at "L" (FIG. 9(6)).

With the signal SEN2 at "H", the voltage of the modulated bitline BLi is sensed and read out (t9 to t10). Only when the memory cell corresponding to the data memory circuit 10 storing the control data of "2" reaches the state of storing the "2" data, the second sub-data of the second sub-data circuit 21 becomes "0" so that the control data are changed to "0". In the other cases, the second sub-data are retained. Time from t7 to t10 is the verify read of the data "2".

With the signals PR02 and RD2 at "H" (t11), the bitline BLi corresponding to the data memory circuit 10 storing the control data of "1" and "0" is charged to the "H" level by the second sub-data circuit 21 (t11 to t12). The bitline BLi corresponding to the data memory circuit 10 storing the control data of "3" and "2" are set at the "L" level by the second sub-data circuit 21 (t11 to t12).

The select gates SG1 and SG2 of the selected block and the non-selected word lines WL1, WL3, WL4 are set at the power supply voltage VCC, and the selected word line WL2 is set at 0.4 V (t12). With the selected word line WL2 at 0.4 V, if the memory cell corresponding to the data memory circuit 10 storing the control data of "1" reaches the state of storing the "1" data, the bitline BLi remains at "H" (FIG. 9(7)). If the memory cell corresponding to the data memory circuit 10 storing the control data of "1" does not reach the state of storing the "1" data, the bitline BLi is set at "L" (FIG. 9(8)). If the memory cell corresponding to the data memory circuit 10 storing the control data of "0" reaches the state of storing the "1", or "2" or "3" data, the bitline BLi remains at "H" (FIG. 9(7)). If the memory cell corresponding to the data memory circuit 10 storing the control data of "0" does not reach the state of storing the "1" data, the bitline BLi is set at "L" (FIG. 9(8)). The bitline BLi corresponding to the data memory circuit 10 storing the control data of "3" and "2" remains at "L" (FIG. 9(9)).

Then with the signal SEN1 at "H", the voltage of the modulated bitline BLi is sensed and read out (t13 to t14). Only when the memory cell corresponding to the data memory circuit 10 storing the control data of "1" reaches the state of storing the "1" data, the first sub-data of the first sub-data circuit 20 becomes "0" so that the control data are changed to "0". In the other cases, the first sub-data are retained. Time from t11 to t14 is verify read of the data "1".

By setting the signal PRE1 at "H" and BCL1 at "L" at time t15, programming verification is completed. By the programming verification operation, the control data stored in the data memory circuit 10 are changed according to the programming state of the memory cell as shown in Table 4.

TABLE 4

| Memory cell programming state | Control data before programming verification | Control data after programming verification |
| --- | --- | --- |
| 0, 1, 2 or 3 | 0 | 0 |
| not reached 1 | 1 | 1 |
| 1 | 1 | 0 |
| not reached 2 | 2 | 2 |
| 2 | 2 | 0 |
| not reached 3 | 3 | 3 |
| 3 | 3 | 0 |

Accordingly, by repeating the programming operation shown in t1 to t9 of FIG. 8 and the programming verification operation shown in FIG. 9 until all the control data become "0", the data programming (program) to the memory cell M can be executed. However, in reality, the verify read of the data "3", the verify read of the data "2", and the verify read of the data "1" are executed selectively as mentioned below.

(1) In order to execute all of the verify read of the data "3", the verify read of the data "2", and the verify read of the data "1", the programming verification operation is executed as shown in FIG. 9.

(2) In order to execute only the verify read of the data "3" and the verify read of the data "2", time t11 to t14 is omitted from the timing chart shown in FIG. 9.

(3) In order to execute only the verify read of the data "3" and the verify read of the data "1", time t7 to t10 is omitted from the timing chart shown in FIG. 9.

(4) In order to execute only the verify read of the data "3", time t7 to t14 is omitted from the timing chart shown in FIG. 9.

(5) In order to execute only the verify read of the data "2" and the verify read of the data "1", time t2 to t6 is omitted from the timing chart shown in FIG. 9.

(6) In order to execute only the verify read of the data "2", time t2 to t6 and time t11 to t14 are omitted from the timing chart shown in FIG. 9.

(7) In order to execute only the verify read of the data "1", time t2 to t10 is omitted from the timing chart shown in FIG. 9.

Figure 10:
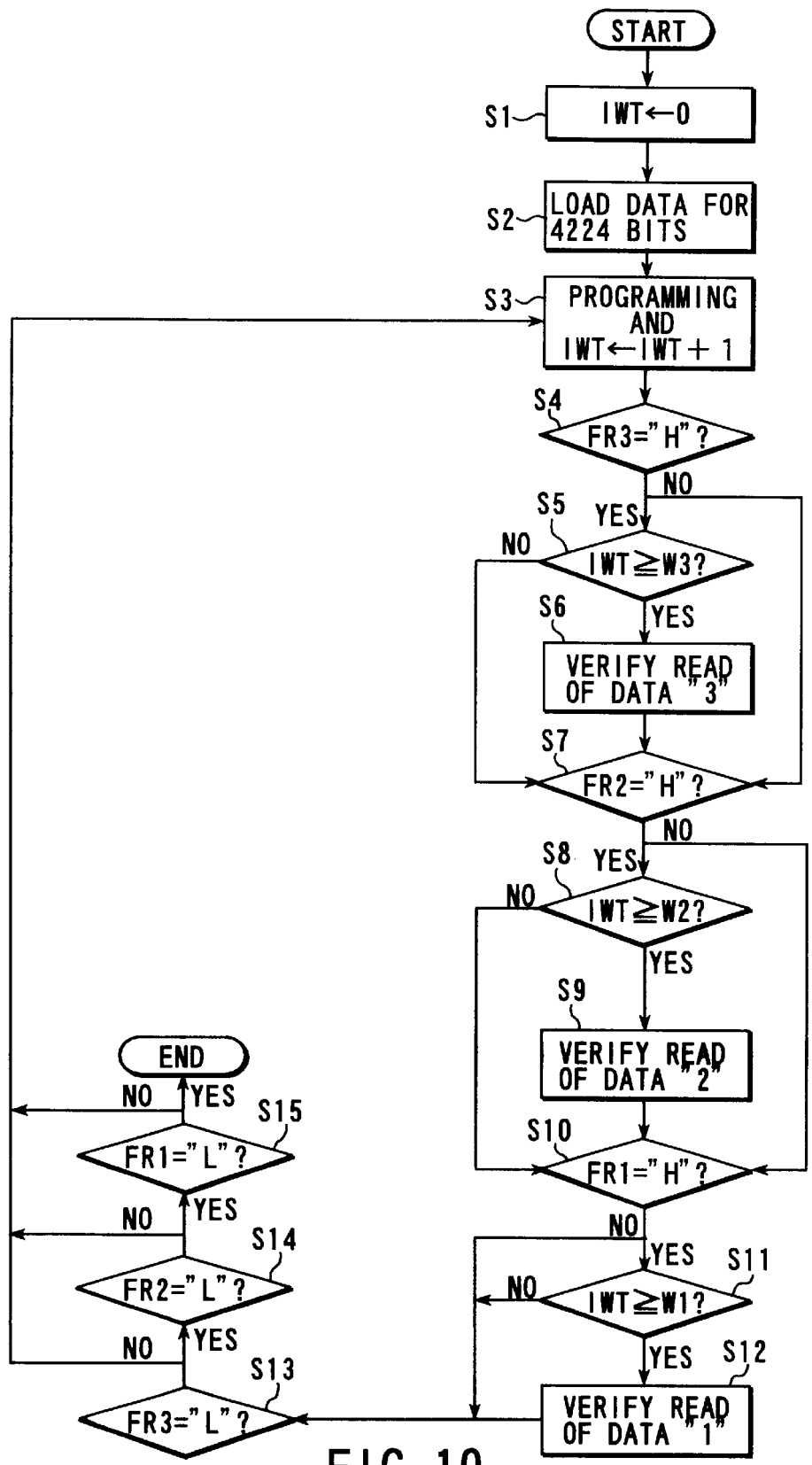
FIG. 10 is a flow chart showing the program flow of multi-level memory in the first embodiment of the present invention.

FIG. 10 shows the detailed flow of the program with respect to the multi-level memory in the first embodiment of the present invention. This program flow is controlled by the control signal and the control voltage generating circuit 7 shown in FIG. 1.

By the command of the program start inputted to the control signal input terminal 8, the program is started. The counter circuit for counting the variable IWT provided in the control signal and control voltage generating circuit 7 is reset to have IWT at 0 (S1). The initial control data for 4224 bits inputted to the data input/output terminal 5 are loaded to the data memory circuit (S2).

After loading the data, the programming operation is executed with the variable IWT being increased by 1 (S3). Whether or not the output FR3 of the data detection circuit 9 is "H" is checked (S4). If the output FR3 of the data detection circuit 9 is "H" and the data "3" remain in the data memory circuit 10, whether or not the variable IWT is not less than the predetermined W3 can be checked (S5). If the variable IWT is not less than W3, the verify read of the data "3" is executed (S6). If the FR3 is at "L" or the variable IWT is less than W3, the verify read of the data "3" is omitted.

Whether or not the output FR2 of the data detection circuit 9 is "H" is checked (S7). If the output FR2 of the data detection circuit 9 is "H" and the data "2" remain in the data memory circuit 10, whether or not the variable IWT is not less than the predetermined W2 can be checked (S8). If the variable IWT is not less than W2, the verify read of the data "2" is executed (S9). If the FR2 is at "L" or the variable IWT is less than W2, the verify read of the data "2" is omitted.

Whether or not the output FR1 of the data detection circuit 9 is "H" is checked (S10). If the output FR1 of the data detection circuit 9 is "H" and the data "1" remain in the data memory circuit 10, whether or not the variable IWT is not less than the predetermined W1 can be checked (S11). If the variable IWT is not less than W1, the verify read of the data "1" is executed (S12). If the FR1 is at "L" or the variable IWT is less than W1, the verify read of the data "1" is omitted.

If all the outputs FR3, FR2, FR1 of the data detection circuit 9 are "L", the program is completed (S13, S14, S15). If even one of the outputs FR3, FR2, FR1 is "H", the programming operation is executed again (S3). Each time the variable IWT increases by 1, the voltage applied to the selected word line at the time of programming (the voltage of the selected word line in the time t3 to t7 shown in FIG. 8) is increased by 0.4 V, and the threshold voltage of the memory cell M for the "1", "2", "3" programming is raised by 0.4 V. The predetermined W1, W2, W3 are determined as mentioned below.

Figure 11:
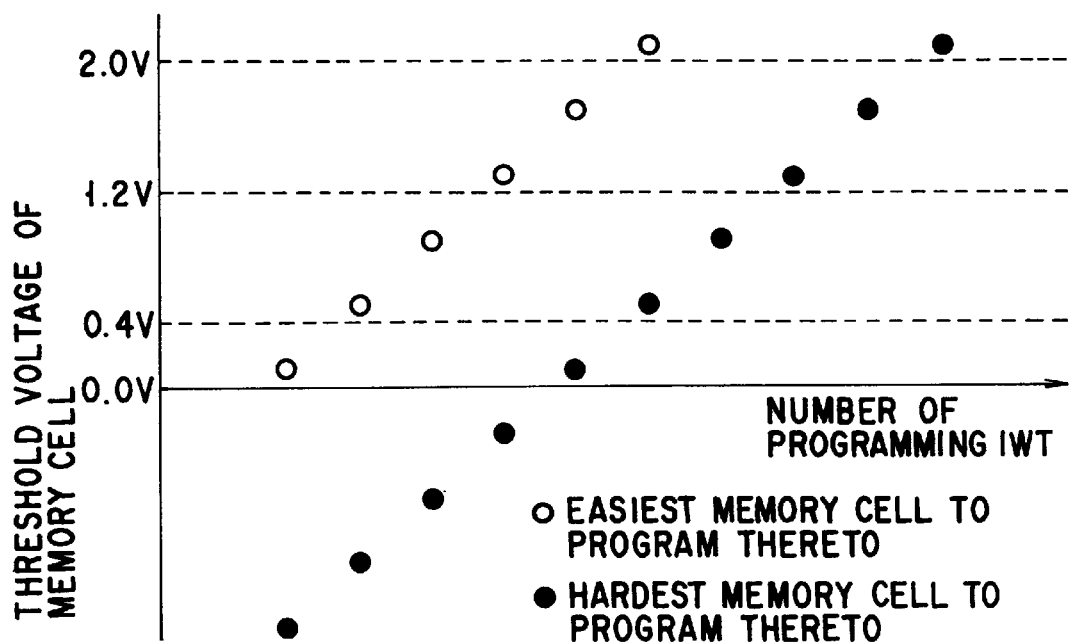
FIG. 11 is a chart showing the programming characteristic of a memory cell in the first embodiment of the present invention.

FIG. 11 shows an example of the programming characteristic of the memory cell M. The horizontal axis represents the programming operation number IWT. The vertical axis represents the threshold voltages of the easiest memory cell to be programmed (white dot) and the hardest memory cell to be programmed (black dot) after the programming operation number IWT. The threshold voltage of the easiest programmed memory cell reaches at 0.1 V after the first programming operation. At the time, the threshold voltage of the hardest programmed memory cell is −1.5 V. Since each time the programming operation number increases by 1, the voltage of the selected word line at the time of programming is increased by 0.4 V, the threshold voltage of the memory cell is raised substantially by 0.4 V accordingly.

Since neither of the threshold voltages of the memory cells reaches 0.4 V after the first programming operation, all the verify read for the data "3", the data "2", and the data "1" is not required. From the second time and later, since the threshold voltage of the easiest programmed memory cell exceeds 0.4 V, the verify read of the data "1" is necessary. Therefore, the W1 can be preliminarily determined as 2. From the fourth time and later, since the threshold voltage of the easiest programmed memory cell exceeds 1.2 V, the verify read of the data "2" is necessary. Therefore, the W2 can be preliminarily determined as 4. From the sixth time and later, since the threshold voltage of the easiest programmed memory cell exceeds 2.0 V, the verify read of the data "3" is necessary. Therefore, the W3 can be preliminarily determined as 6.

After the sixth time programming operation, even the threshold voltage of the hardest programmed memory cell exceeds 0.4 V. Therefore, the output FR1 of the data detection circuit becomes "L" at least from IWT=7 or later, and thus the verify read of the data "1" is unnecessary. After the eighth time programming operation, even the threshold voltage of the hardest programmed memory cell exceeds 1.2 V. Therefore, the output FR2 of the data detection circuit becomes "L" at least from IWT=9 or later, and thus the verify read of the data "2" is unnecessary. After the tenth time programming operation, even the threshold voltage of the hardest programmed memory cell exceeds 2.0 V. Therefore, the output FR3 of the data detection circuit becomes "L" at least from IWT=11 or later. Thus if all of FR1, FR2, FR3 become "L", the program is completed as shown in FIG. 10.

Figure 12:
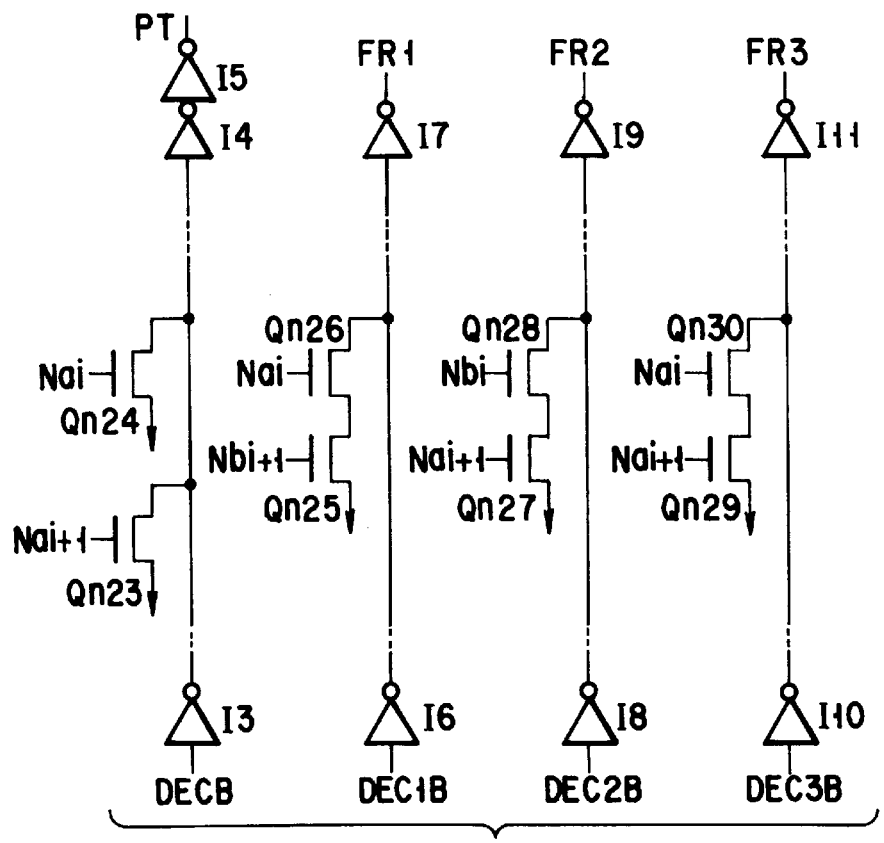
FIG. 12 is a diagram showing a modification of the data detection circuit shown in FIG. 1.

FIG. 12 shows a modification of the data detection circuit 9 shown in FIG. 1. Adjacent to each of the data memory circuits 10 shown in FIG. 2, n-channel MOS transistors Qn23, Qn24, Qn25, Qn26, Qn27, Qn28, Qn29, Qn30 are provided. To the gate electrode of Qn23, the node Nai+1 of the second sub-data circuit 21 shown in FIG. 5 is connected. To the gate electrode of Qn24, the node Nai of the first sub-data circuit 20 shown in FIG. 5 is connected. To the gate electrode of Qn25, the node Nbi+1 of the second sub-data circuit 21 shown in FIG. 5 is connected. To the gate electrode of Qn26, the node Nai of the first sub-data circuit 20 shown in FIG. 5 is connected. To the gate electrode of Qn27, the node Nai+1 of the second sub-data circuit 21 shown in FIG. 5 is connected. To the gate electrode of Qn28, the node Nbi of the second sub-data circuit 21 shown in FIG. 5 is connected. To the gate electrode of Qn29, the node Nai+1 of the second sub-data circuit 21 shown in FIG. 5 is connected. To the gate electrode of Qn30, the node Nai of the first sub-data circuit 20 shown in FIG. 5 is connected.

If DECB inputted to the inverter I3 becomes "L", and the output PT of the inverters I4, I5 is "H", the control data of all the data memory circuits 10 are "0". If DEC1B inputted to the inverter I6 becomes "L", and the output FR1 of the inverter I7 is "H", the control data of at least one of the data memory circuits 10 are "1". If DEC2B inputted to the inverter I8 becomes "L", and the output FR2 of the inverter I9 is "H", the control data of at least one of the data memory circuits 10 are "2". If DEC3B inputted to the inverter I10 becomes "L", and the output FR3 of the inverter I11 is "H", the control data of at least one of the data memory circuits 10 are "3". The signals DECB, DEC1B, DEC2B, DEC3B are signals from the control signal and control voltage generating circuit 7. The signals PT, FR1, FR2, FR3 are fed back to the control signal and control voltage generating circuit 7. By the data detection circuit 9 shown in FIG. 12, data detection can be executed simultaneously at a high speed. Therefore, as shown in FIG. 8, not at the time of the programming operation, but immediately before the verify read of the data "3" (time t1 to t2 shown in FIG. 9), the signal FR3 can be checked with the signal DEC3B set at "L". Similarly, immediately before the verify read of the data "2" (time t6 to t7 shown in FIG. 9), the signal FR2 can be checked with the signal DEC2B set at "L". Immediately before the verify read of the data "1" (time t10 to t11 shown in FIG. 9), the signal FR1 can be checked with the signal DEC1B set at "L". After the programming verification operation shown in FIG. 9, by checking the signal PT with the signal DECB set at "L", the steps S13, S14, S15 of FIG. 10 can be executed in one step. Therefore, the unnecessary programming operation for one time can be omitted so that programming can be executed at a higher speed.

Figure 13:
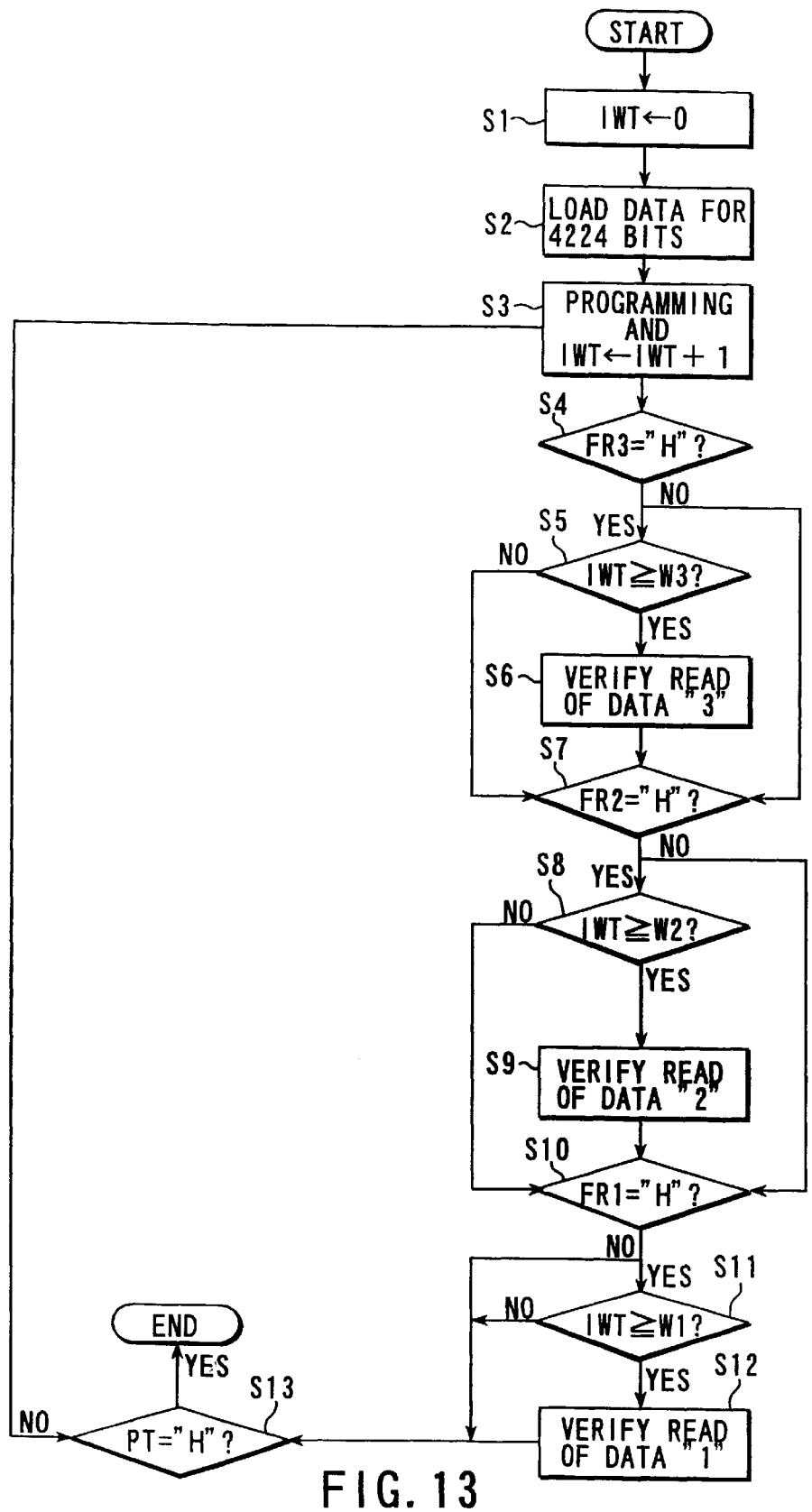
FIG. 13 is a flow chart showing a modification of a program flow of a multi-level memory in the first embodiment of the present invention.

FIG. 13 shows the program flow of the case the data detection circuit 9 shown in FIG. 12 is used. The steps S4, S7, S10 can be executed by checking the signals FR3, FR2, FR1 with the signals DEC3B, DEC2B, DEC1B at "L". The step S13 can be executed by checking the signal PT with the signal DECB at "L". Since the other cases are the same as the flow shown in FIG. 10, explanation is not provided here.

Figure 14:
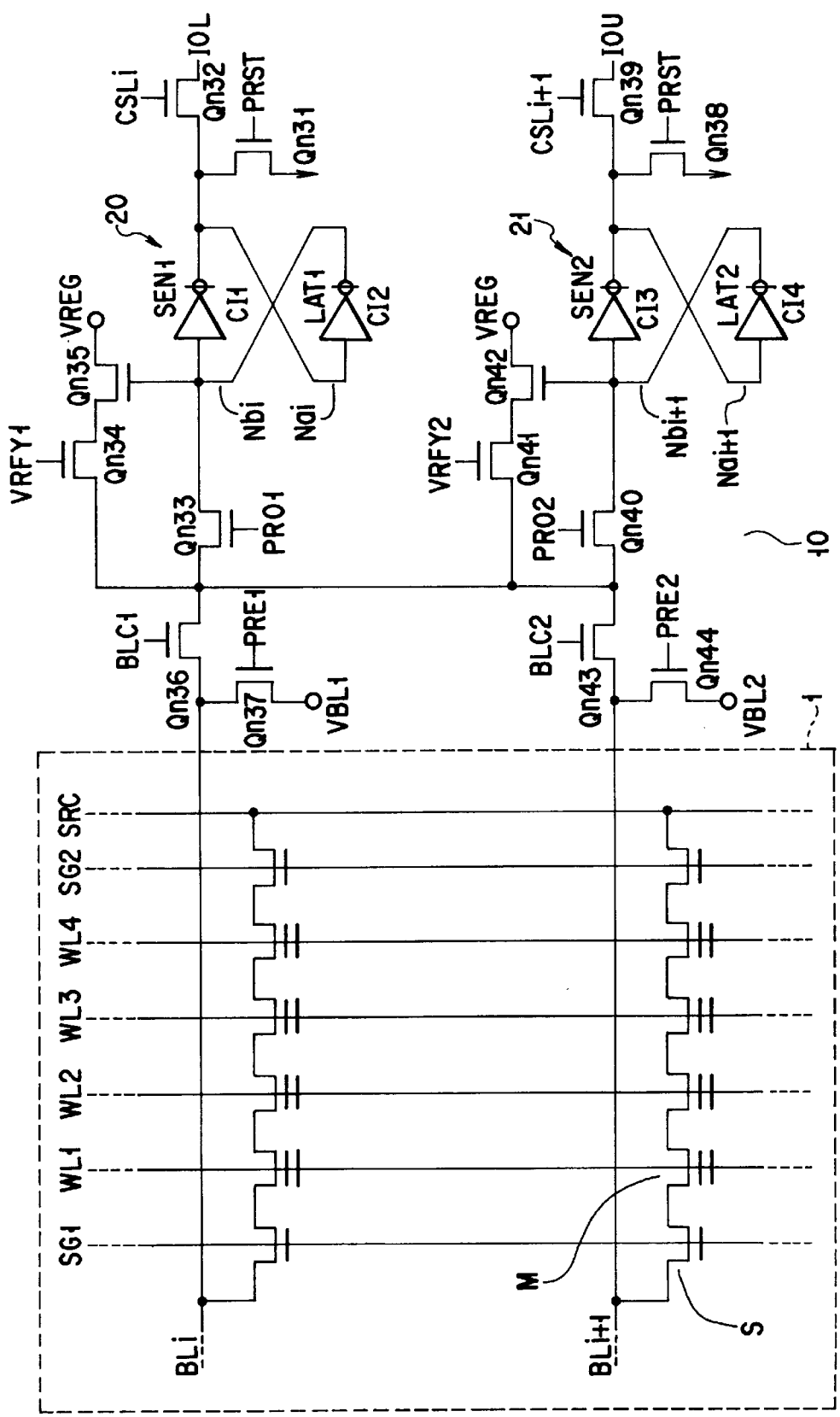
FIG. 14 is a circuit diagram for explaining a concrete configuration of the memory cell array and the bitline control circuit of the second embodiment of the present invention shown in FIG. 1.

FIG. 14 is a circuit diagram for explaining the concrete configuration of the memory cell array 1 and the bitline control circuit 2 shown in FIG. 1. An example of four-level memory EEPROM is shown as a multi-level memory.

In the multi-level memory according to the second embodiment of the present invention, the first sub-data circuit 20 in the data memory circuit 10 comprises the clock synchronous inverters CI1 and CI2, and the n-channel MOS transistors Qn33, Qn34, Qn35. The second sub-data circuit 21 comprises the clock synchronous inverters CI3 and CI4, and the n-channel MOS transistors Qn40, Qn41, Qn42. The first and second sub-data circuits 20 and 21 store the first and second sub-data respectively at the time of programming, and store the first and second reading sub-data respectively at the time of reading. The state where the node Nai in the first sub-data circuit 20 is at the "H" level is the state where the first sub-data circuit 20 stores the first reading sub-data of "1" or the first sub-data of "1". The state where the node Nai+1 in the second sub-data circuit 21 is at the "H" level is the state where the second sub-data circuit 21 stores the second reading sub-data of "1" or the second sub-data of "1". The state where the node Nai in the first sub-data circuit 20 is at the "L" level is the state where the first sub-data circuit 20 stores the first reading sub-data of "0" or the first sub-data of "0". The state where the node Nai+1 in the second sub-data circuit 21 is at the "L" level is the state where the second sub-data circuit 21 stores the second reading sub-data of "0" or the second sub-data of "0".

The n-channel MOS transistors Qn32 and Qn39 are for electrically connecting the first and second sub-data circuits 20 and 21, and the data input/output lines IOL and IOU. To the respective gate electrode, the outputs CSLi and CSLi+1 from the column decoder 3 are provided. For example, when CSLi reaches "H", the first sub-data circuit 20 of the data memory circuit 10 provided to the bitlines BLi and BLi+1 and the data input/output line IOL are electrically connected. The data input/output lines IOL and IOU are connected to the data input/output buffer 4 so that sub-data can be set in the first sub-data circuit 20. Or the reading sub-data of the first sub-data circuit can be outputted to the data input/output buffer 4.

The n-channel MOS transistors Qn36 and Qn43 control the electric connection between the first and second sub-data circuits 20 and 21, and the bitline BLi or BLi+1. If the signal BCL1 is "H" and BLC2 is "L", the first and second sub-data circuits 20 and 21, and the bitline BLi are electrically connected. If the signal BLC1 is "L" and BLC2 is "H", the first and second sub-data circuits 20 and 21, and the bitline BLi+1 are electrically connected.

The n-channel MOS transistors Qn37 and Qn44 control the electric connection between the bitline BLi and the voltage VBL1, and the electric connection between the bitline BLi+1 and the voltage VBL2. If the signal PRE1 is "H", the bitline BLi and the voltage VBL1 are electrically connected. If the signal PRE2 is "H", the bitline BLi+1 and the voltage VBL2 are electrically connected.

The n-channel MOS transistors Qn31 and Qn38 are for setting the signal PRST at "H" and setting the sub-data of "0" in the first and second sub-data circuits 20 and 21.

The signal for indicating the data or the programming state of the memory cell is transferred via the bitline BLi or BLi+1. The clock synchronous inverter CI1 in the first sub-data circuit 20 and the clock synchronous inverter CI3 in the second sub-data circuit 21 function also as the sense amplifier for sensing the logic level of the signal of the bitline BL. Although the clock synchronous inverter senses the absolute value of the voltage of the bitline BL as the logic level in this example, a differential sense amplifier can also be used. In that case, the difference with respect to the reference voltage is detected as the logic level.

Figures 15A, 15B:
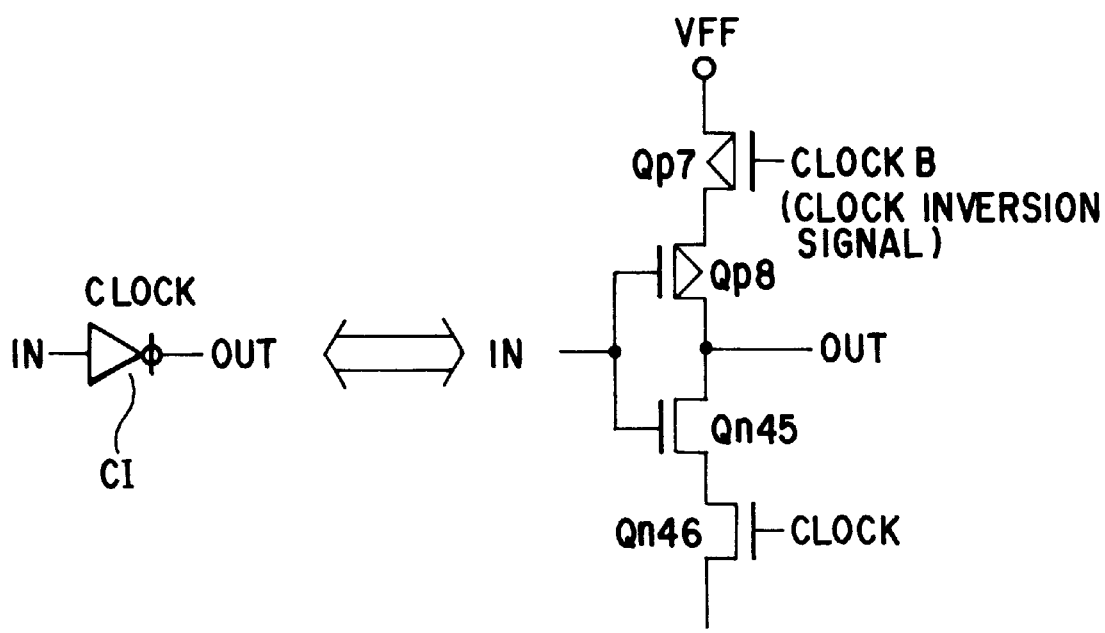
FIGS. 15A and 15B are a symbol diagram of a clock synchronous inverter shown in FIG. 14 and a detailed circuit diagram thereof.

The concrete configuration of the clock synchronous inverter CI shown in FIG. 14 is shown in FIGS. 15A and 15B. FIG. 15A is a symbol diagram, and FIG. 15B is a detailed circuit diagram thereof. The input terminal of the inverter circuit comprising the n-channel MOS transistor Qn45 and the p-channel MOS transistor Qp8 is IN and the output terminal is OUT. In order to activate or deactivate the inverter circuit by the signal CLOCK and the inverse signal CLOCK thereof, the n-channel MOS transistor Qn46 and the p-channel MOS transistor Qp7 are provided. The signal CLOCK is activated at "H", the signal CLOCKB is activated at "L", the signal CLOCK is deactivated at "L", and the signal CLOCKB is deactivated at "H".

The signals SEN1, LAT1, SEN2, LAT2, PRO1, PRO2, BLC1, BLC2, PRE1, PRE2, VRFY1, VRFY2, PRST, the voltages VBL1, VBL2, VREG, VFF are output signals from the control signal and control voltage generating circuit 7, which are common to all of the data memory circuits 10 shown in FIG. 2. The voltage VCC is the power supply voltage, for example, 3.3 V.

The first and second sub-data circuits 20 and 21 store the sub-data of "0" or "1", change the stored sub-data of "1" responding to the "H" level of the bitline signal to the sub-data of "0", and retain the sub-data of "0". That is, before the signal PRO1 or PRO2 becomes "H" so that the voltage level of the bitline BL is sensed by the clock synchronous inverter CI1 or CI3, the voltage level of the bitline BL is adjusted by the n-channel MOS transistors Qn34, Qn35 or Qn41, Qn42 according to the first or second sub-data. Only when the first or second sub-data are "0", the voltage level of the bitline BL is set to be "H". With the signal PRO1 or PRO2 at "H", and the "H" level of the bitline transferred to the input terminal of the clock synchronous inverter CI1 or CI3, the node Nai or Nai+1 is set at the "L" level. Further, by the clock synchronous inverter CI2 or CI4, the sub-data of "0" are stored.

Therefore, the originally stored sub-data of "0" are not changed. On the other hand, with the originally stored sub-data of "1", if the level of the bitline BL is "H", it is changed to the sub-data of "0" and stored. If the level of the bitline BL is "L", the sub-data of "1" are stored. The first and second sub-data circuits 20 and 21 are not limited to the configuration shown in FIG. 14, but can be realized in various circuits having the above-mentioned functions.

Figure 16A:
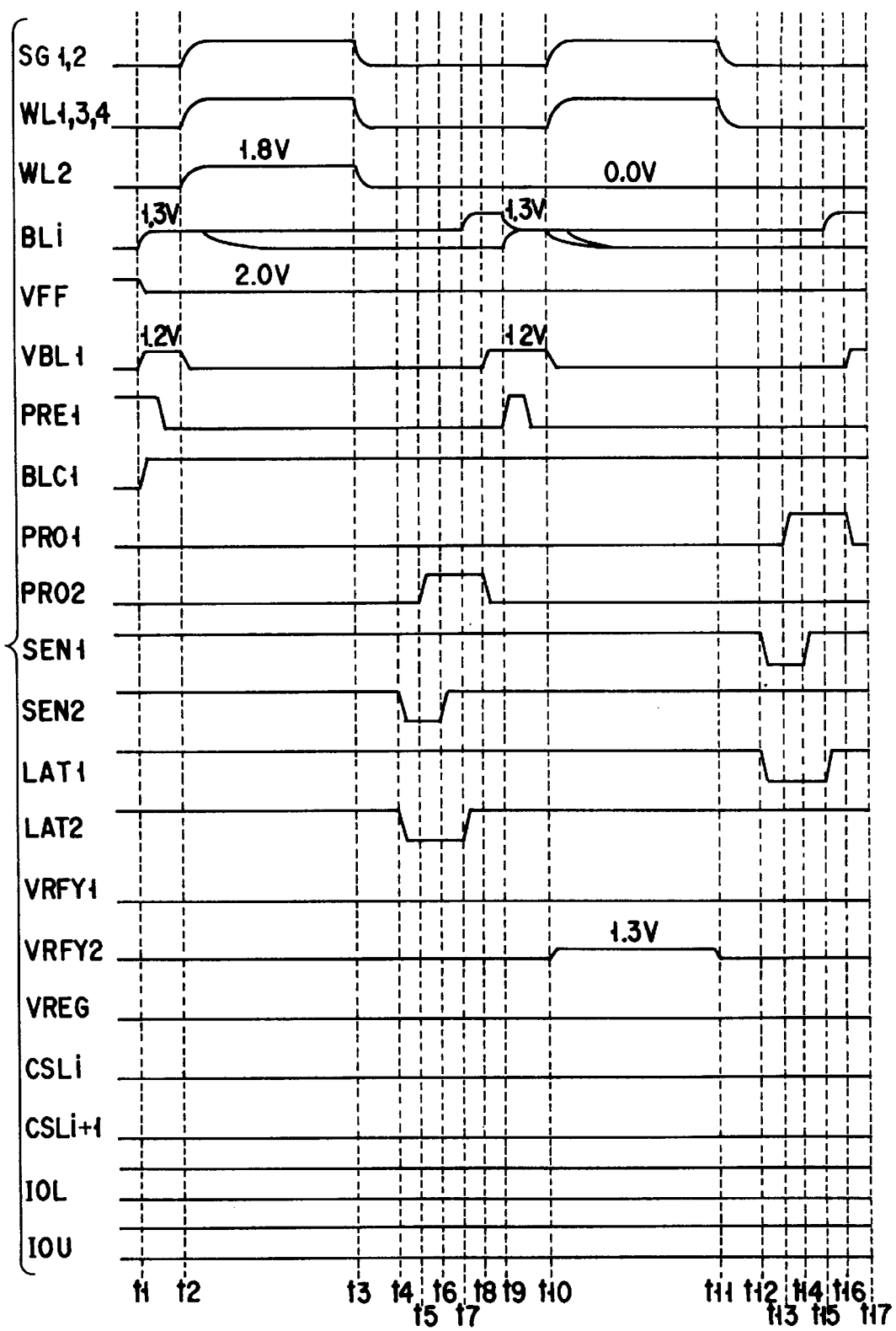
FIGS. 16A and 16B are timing charts showing the reading operation of four-level data stored in the memory cell in the second embodiment of the present invention.
Figure 16B:
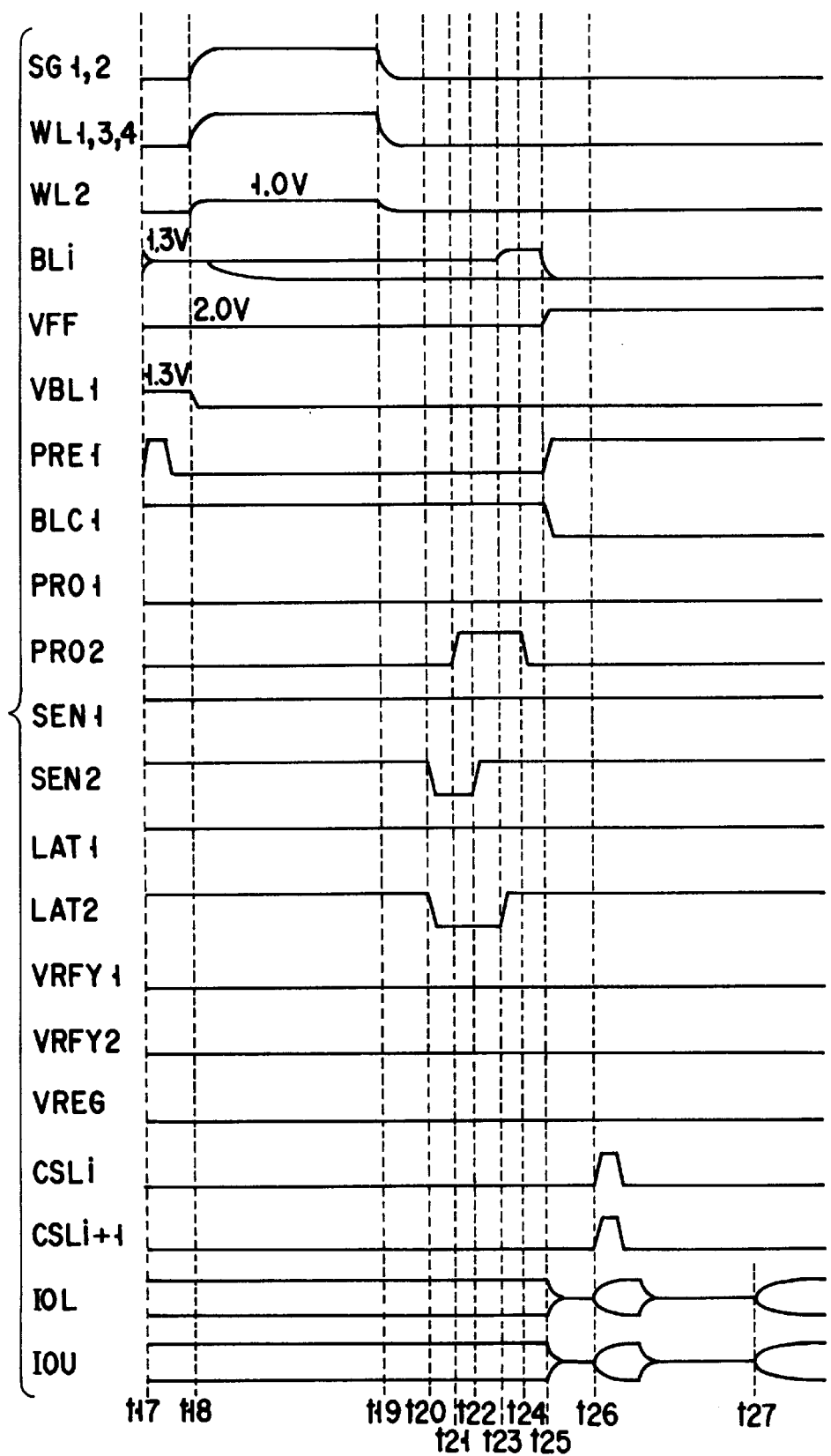

FIGS. 16A and 16B show the reading operation of four-level data stored in the memory cell. Here, an example where bitlines BL0, BL2, . . . , BLi, . . . , BL4222 are selected (BLi is shown as the representative thereof), and the word line WL2 is selected is shown. If the memory level is defined to be three levels, three-level memory can be realized readily. Since the voltage VBL2 is 0 V, BLC2 is "L", PRE2 is "H", PRST is "L", and the bitline BLi+1 remains at 0 V, they are not shown in FIGS. 16A and 16B.

With the voltage VBL1 at 1.3 V, the bitline BLi is charged to "H" (t1). With the signal BCL1 at "H", the bitline BLi is selected (t1). The voltage VFF is fixed at 2 V for stabilizing the sense sensitivity of the clock synchronous inverters CI1 and CI3 to serve as the sense amplifiers. With the signal PRE1 at "L", the bitline BLi and the voltage VBL1 are disconnected. Then the select gates SG1 and SG2 of the selected block and the non-selected word line WL1, WL3, WL4 are set at the power supply voltage VCC, and the selected word line WL2 is set at 1.8 V (t2).

Here the relationship between the data and the threshold voltage stored in the memory cell is shown in Table 5.

TABLE 5

| Memory cell data | Memory cell threshold voltage |
| --- | --- |
| 0 | 0 V or less |
| 1 | 0.4 V–0.8 V |
| 2 | 1.2 V–1.6 V |
| 3 | 2.0 V–2.4 V |

With the selected word line WL2 at 1.8 V, only when the memory cell stores the "3" date, the bitline BLi remains at "H". In the other cases, the bitline BLi becomes "L". After the select gates SG1 and SG2, the word lines WL1 to WL4 are reset at 0 V (t3), the signals SEN2 and LAT2 become "L" so that the clock synchronous inverters CI3 and CI4 are deactivated (t4). With the signal PRO2 at "H" (t5) and the signal SEN2 at "H" (t6), the clock synchronous inverter CI3 is activated and the voltage of the bitline BLi is sensed. With the signal LAT1 at "H" (t7), the clock synchronous inverter CI4 is activated and the sensed logic level of the signal of the bitline BLi is latched. With the signal PRO1 at "L" (t8), the operation for detecting whether or not the threshold voltage of the memory cell M is not less than 1.8 V is completed. Only when the memory cell stores the "3" data, the first reading sub-data of the second sub-data circuit 21 becomes "0". In the other cases, the second reading sub-data are "1".

Then the operation for detecting whether or not the threshold voltage of the memory cell M is not less than 0.0 V is executed. With the voltage VBL1 at 1.2 V (t8), and the signal PRE1 at "H", the bitline BLi is charged to "H" (t9). With the signal PRE1 at "L", the bitline BLi and the voltage VBL1 are disconnected. The select gates SG1 and SG2 of the selected block and the non-selected word lines WL1, WL3, WL4 are set at the power supply voltage VCC, and the selected word line WL2 remains at 0.0 V (t10). At the same time, the signal VRFY2 is set at 1.3 V, and the n-channel MOS transistor Qn41 is executed. Accordingly, only when the second reading sub-data is "0", the potential of the bitline BLi is changed to "L" by the n-channel MOS transistors Qn41, Qn42 (t10 to t11).

With the selected word line WL2 at 0.0 V, only when the memory cell stores the data of "1" or "2", the bitline BLi remains at "H". In the other cases, the bitline BLi becomes "L". After the select gates SG1 and SG2, and the word lines WL1 to WL4 are reset at 0 V (t11), the signals SEN1 and LAT1 becomes "L" that the clock synchronous inverters CI1 and CI2 are deactivated (t12). With the signal PRO1 at "H" (t13) and the signal SEN1 at "H" (t14), the clock synchronous inverter CI1 is activated so that the voltage of the bitline BLi is sensed. With the signal LAT1 at "H" (t15), the clock synchronous inverter CI2 is activated so that the logic level of the sensed signal of the bitline BLi is latched. With the signal PRO1 at "L" (t16), the operation for detecting whether or not the threshold voltage of the memory cell M is not less than 0.0 V is completed. Only when the memory cell stores the data of "1" or "2", the first reading sub-data of the first sub-data circuit 20 become "0". In the other cases, the first reading sub-data are "1".

Then the operation for detecting whether or not the threshold voltage of the memory cell M is not less than 1.0 V is executed. With the voltage VBL1 at 1.2 V (t16) and the signal PRE1 at "H", the bitline BLi is charged to "H" (t17). Then the signal PRE1 becomes "L" so that the bitline BLi and the voltage VBL1 are disconnected. The select gates SG1 and SG2 of the selected block and the non-selected word lines WL1, WL3, WL4 are set at the power supply voltage VCC, and the selected word line WL2 is set at 1.0 V (t18).

With the selected word line WL2 at 1.0 V, only when the memory cell stores the data of "3" or "2", the bitline BLi remains "H". In the other cases, the bitline BLi becomes "L". After the select gates SG1 and SG2, and the word lines WL1 to WL4 are reset at 0 V (t19), the signals SEN2 and LAT2 become "L" so that the clock synchronous inverters CI3 and CI4 are deactivated (t20). With the signal PRO2 at "H" (t21), and the signal SEN2 at "H" (t22), the clock synchronous inverter CI3 is activated and the voltage of the bitline BLi is sensed. With the signal LAT2 at "H" (t23), the clock synchronous inverter CI4 is activated, and the logic level of the sensed signal of the bitline BLi is latched. With the signal PRO2 at "L" (t24), the operation for detecting whether or not the threshold voltage of the memory cell M is not less than 1.0 V is completed. Only when the memory cell stores the "3" or "2" data, the second reading sub-data of the second sub-data circuit 21 become "0". In the other cases, the second reading sub-data are "1".

With the signal BCL1 at "L", the signal PRE1 at "H", and the voltage VFF at VCC, the operation for storing the data of the memory cell M in the data memory circuit 10 as the reading data is completed.

With the signals CSLi, CSLi+1 at "H" (t26), the first reading sub-data are outputted to the data input/output line IOL, and the second reading sub-data are outputted to the data input/output line IOU. Then they are outputted to the outside from the data input/output terminal 5 via the data input buffer 4. The relationship between the four-level data of the memory cell and the first and second reading sub-data is shown in Table 6.

TABLE 6

| Memory cell data | First reading sub-data | Second reading sub-data |
| --- | --- | --- |
| 0 | 1 | 1 |
| 1 | 0 | 1 |
| 2 | 0 | 0 |
| 3 | 1 | 0 |

Figure 17:
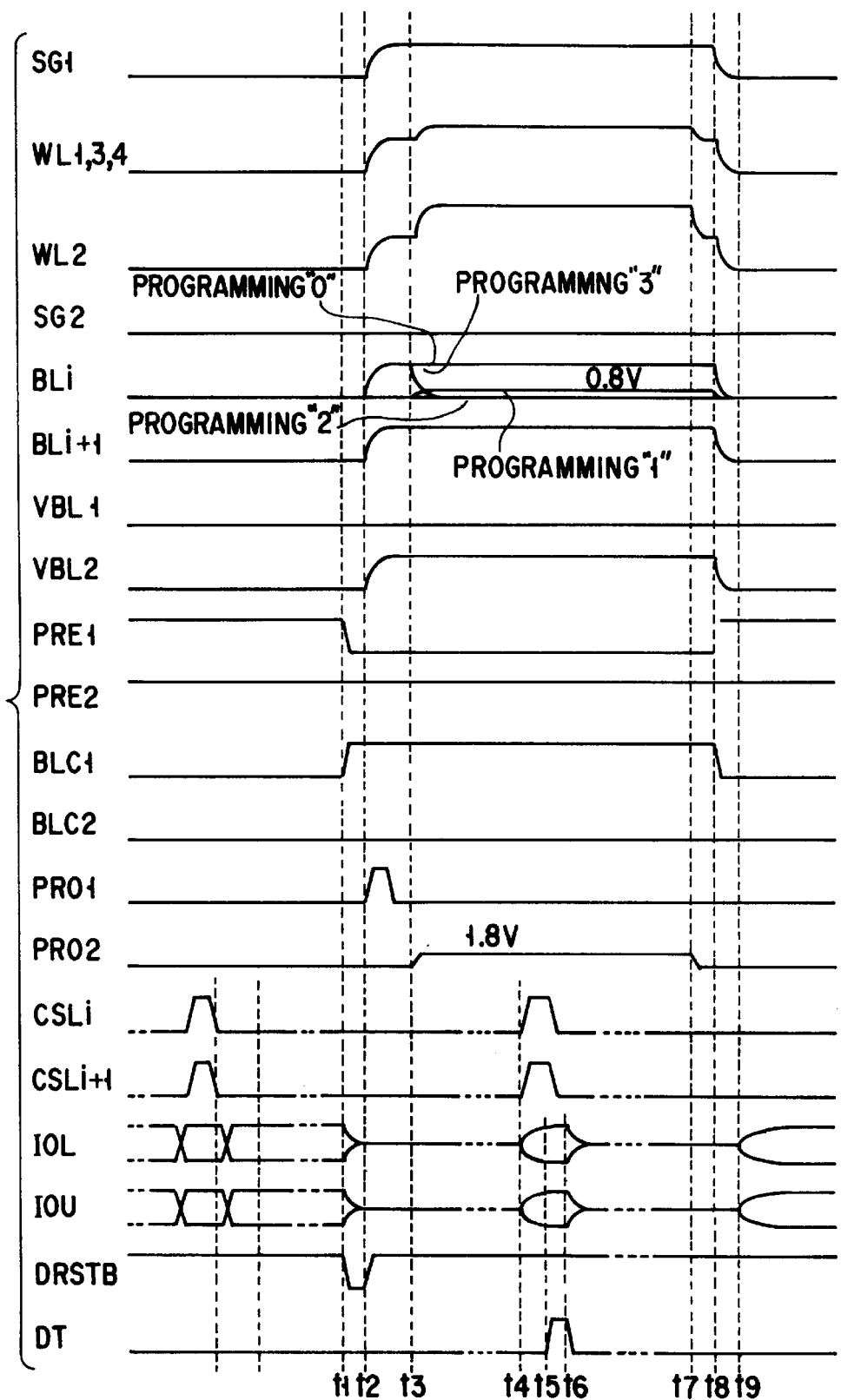
FIG. 17 is a timing chart showing the initial setting of control data to the data memory circuit and the programming operation in the second embodiment of the present invention.

FIG. 17 shows the initial setting of the control data in the data memory circuit 10 and the programming operation. Here, an example where bitlines BL0, BL2, . . . , BLi, . . . , BL4222 are selected (BLi is shown as the representative thereof), and the word line WL2 is selected is shown. If the memory level is defined to be three levels, three-level memory can be realized readily.

The initial setting of the control data to the data memory circuit 10 provided for the bitline BLi is executed as mentioned below. With the initial sub-data of the first sub-data circuit 20 transferred to the data input/output line IOL, the initial sub-data of the second sub-data circuit 21 transferred to the data input/output line IOU, and the signal CSLi+1 at "H", the initial sub-data are stored in the first and second sub-data circuits 20 and 21. By changing the selection of the signal CSL, the initial control data can be set in an optional number of the data memory circuits 10. In this case, the relationship between the initial control data and the initial sub-data is shown in Table 7 as mentioned below.

TABLE 7

| Initial control data | Initial sub-data of the first sub-data circuit | Initial sub-data of the second sub-data circuit |
| --- | --- | --- |
| 0 | 0 | 0 |
| 1 | 1 | 0 |
| 2 | 1 | 1 |
| 3 | 0 | 1 |

Herein it is preferable to reset the control data of all the data memory circuits 10 at "0" by setting the signal PRST at "H" before setting the initial control data. As later explained specifically, since the state of the memory cell cannot be changed by the control data "0", among 2112 pieces of the data memory circuits 10, the initial control data can be set from the outside only to desired data memory circuits 10. Of course the initial control data can be set from the outside to all the 2112 pieces of the data memory circuits 10. Since the signal SEN1 remains at "H", LAT1 at "H", VRFY1 at "L", SEN2 at "H", LAT2 at "H", VRFY2 at "L", the voltage VREG at 0 V, and VFF AT VCC, they are not shown in FIG. 17.

In the programming operation, with the signal PRE1 at "L", the bitline BLi and the voltage VBL1 are disconnected (t1). At the same time, with the signal BLC1 at "H", the bitline BLi is selected (t1). With the signal DRSTB at "L", the data detection circuit 9 is reset (t1 to t2). With the voltage VBL2 at VCC, then selected bitline BLi+1 is charged to VCC via the n-channel MOS transistor Qn44 (t2 to t3). With the signal PRO1 at "H", the select bit line BLi is charged according to the first sub-data (t2 to t3). At the time, the bitline BLi is charged to VCC when the control data are "0" or "3", and is set at 0 V when the control data are "1" or "2". The select gate SG1 and the word lines WL1 to WL4 are set at VCC (t2 to t3). The select gate SG2 remains at 0 V. Then with the signal PRO2 at 1.8 V, the voltage of the select bit line BLi is changed according to the second sub-data (t3). If the second sub-data are "0", the bitline BLi preliminarily set at 0 V is charged to 0.8 V, which is lower than 1.8 V by the threshold voltage (for example, 1 V) of the n-channel MOS transistor Qn4. If the second sub-data are "0", the bitline BLi preliminarily set at VCC remains at VCC since the n-channel MOS transistor Qn40 is not executed. If the second sub-data are "1", since the n-channel MOS transistor Qn40 is conducted, the bitline BLi is 0 V.

As a consequence, the bitline BLi becomes VCC when the control data are "0", 0.8 V when the control data are "1", 0

V when the control data are "2", and 0 V when the control data are "3". With the selected word line WL2 at 20 V, and the non-selected word line at 10 V, electron injection from the memory cell to the floating gate is started according to the control data (t3 to t7). If the bitline BL is 0 V, the electron injection is carried out with the potential difference between the channel of the memory cell and the word line at 20 V. If the bitline BL is 0.8 V, the electron injection is carried out with the potential difference between the channel of the memory cell and the word line at 19.2 V, but the potential difference between the channel of the memory cell and the word line is smaller than the case of the potential difference of 20 V. In the case the bitline BL is VCC, since the potential difference between the channel of the memory cell and the word line is small, the electron injection does not occur substantially.

While the selected word line WL2 set at 20 V (t3 to t7), the control data stored in the data memory circuit 10 are detected. By the column decoder, from CSL0 and CSL1 to CSL4222 and CSL4223 are selected successively so that the control data are transferred to the data detection circuit 9 via the data input/output lines IOL and IOU. An example where CSLi and CSLi+1 are selected is shown in FIG. 17. With CSLi and CSLi+1 at "H" (t4), data outputted to the data input/output lines IOL and IOU, and the signal DT at "H", the control data are detected by the data detection circuit 9 (t5 to t6). If even one of the data memory circuits 10 stores the data "1", the signal FR1 becomes "H". If even one of the data memory circuits 10 stores the data "2", the signal FR2 becomes "H". If even one of the data memory circuits 10 stores the data "3", the signal FR3 becomes "H".

After the word lines WL1 to WL4 dropped to VCC (t7 to t8), with the voltage VBL2 at 0 V, and the signal PRE1 at "H", the bitlines BLi and BLi+1 are reset at 0 V (t8 to t9). The voltage VBL1 is 0 V. The word lines WL1 to WL4 are reset at 0 V (t8 to t9).

Figure 18A:
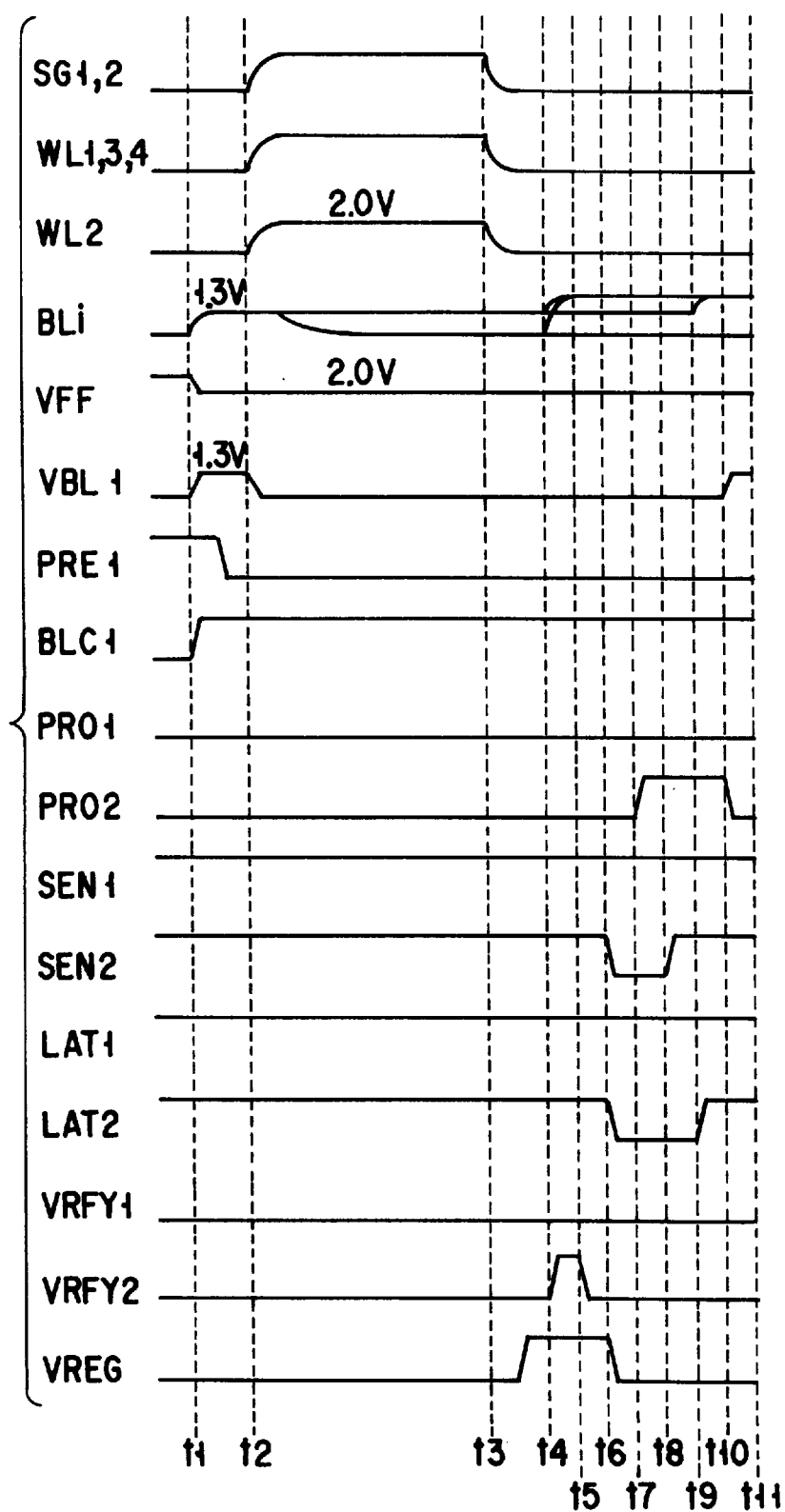
FIGS. 18A to 18C are timing charts showing the programming verification operation in the second embodiment of the present invention.
Figure 18B:
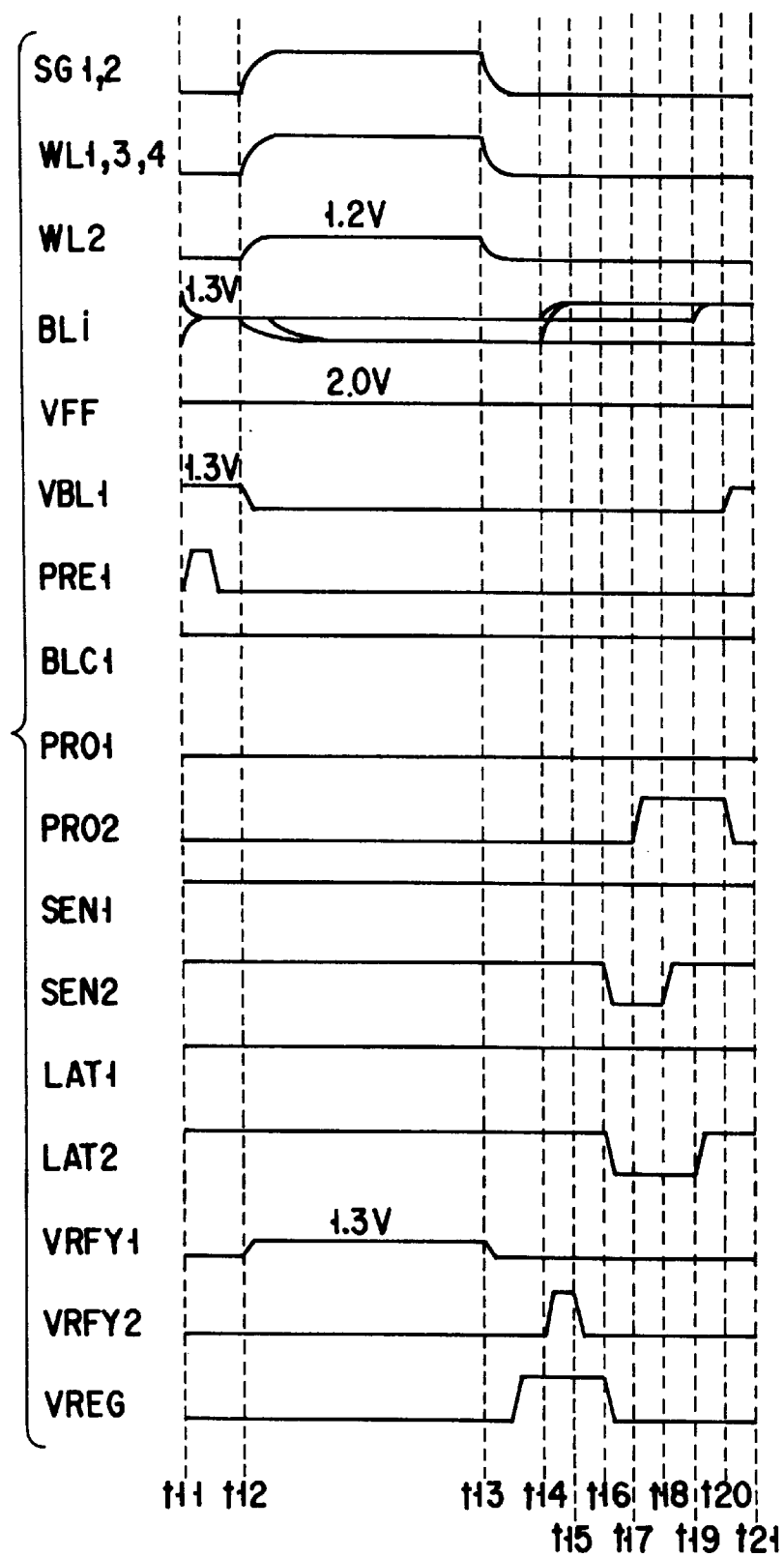
Figure 18C:
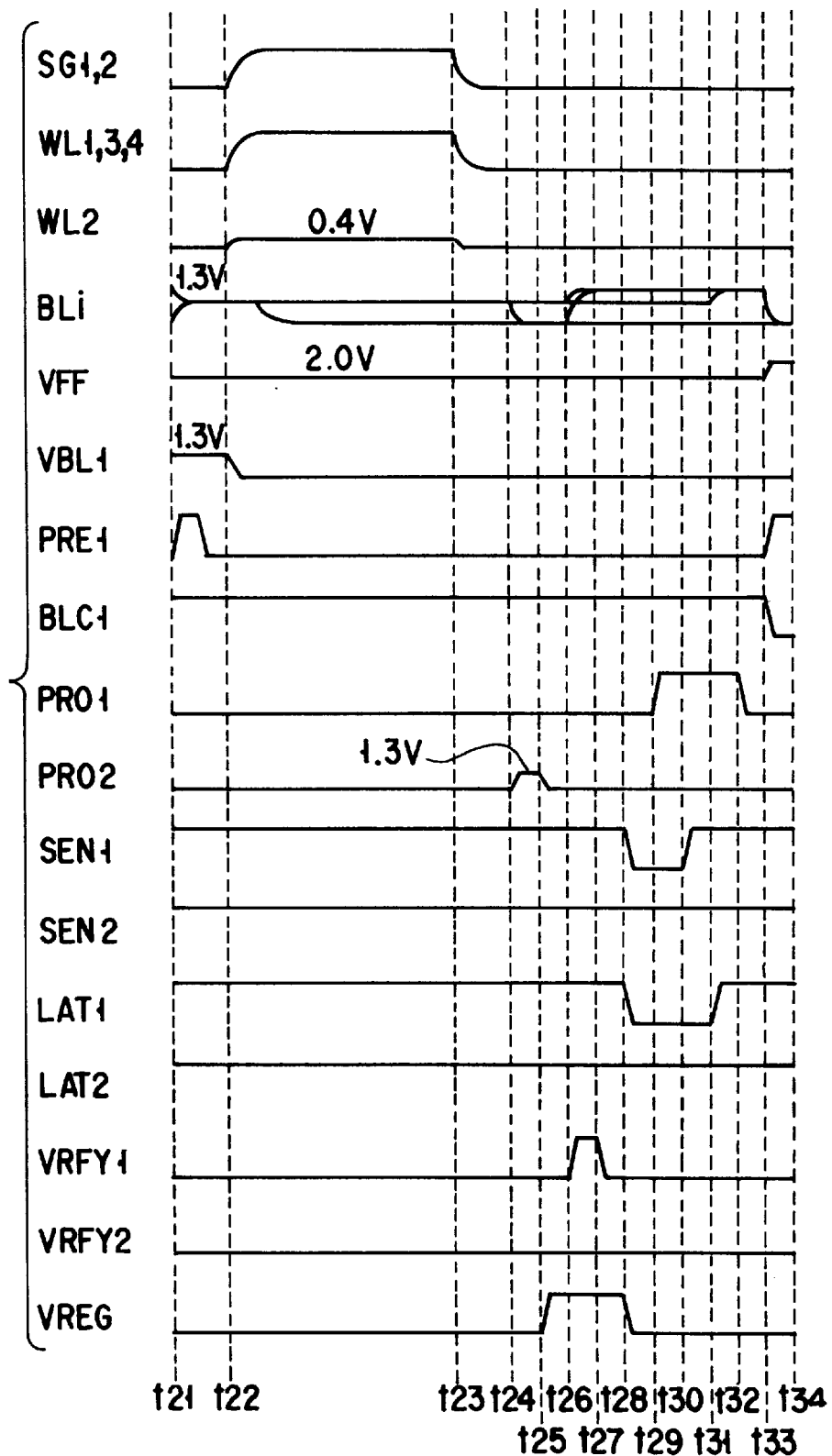

FIGS. 18A to 18C show the programming verification operation for detecting the programming state of the memory cell after the programming operation in time t1 to t9 shown in FIG. 17. Here, an example where bitlines BL0, BL2, ..., BLi, ..., BL4222 are selected (BLi is shown as the representative thereof), and the word line WL2 is selected is shown. If the memory level is defined to be three levels, three-level memory can be realized readily. Since the voltage VBL2 remains at 0 V, BLC2 at "L", PRE2 at "H", PRST at "L", CSL1 at "L", CSLi+1 at "L", and the bitline BLi+1 at 0 V, they are not shown in FIGS. 18A to 18C.

With the voltage VBL1 at 1.3 V, the bitline BLi is charged to "H" (t1). The voltage VFF is fixed at 2.0 V. With the signal PRE1 at "L", the bitline BLi and the voltage VBL1 are disconnected. The select gates SG1 and SG2 of the selected block and the non-selected word lines WL1, WL3, WL4 are set at the power supply voltage VCC, and the selected word line WL2 is set at 2.0 V (t2).

With the selected word line WL2 at 2.0 V, if the memory cell corresponding to the data memory circuit 10 storing the control data of "3" reaches the state of storing the "3" data, the bitline BLi remains at "H". If the memory cell corresponding to the data memory circuit 10 storing the control data of "3" does not reach the state of storing the "3" data, the bitline BLi becomes "L". Since the memory cell corresponding to the data memory circuit 10 storing the control data of "2" or "1" does not reach the state of storing the "3" data, the bitline BLi becomes "L". After the select gates SG1 and SG2, and the word lines WL1 to WL4 are reset at 0 V (t3), only when the signal VRFY2 becomes "H" and the second sub-data are "0", the bitline BLi is set at "H" (t4). Here the voltage VREG is VCC. With the signals SEN2 and LAT2 at "L", the clock synchronous inverters CI3 and CI4 are deactivated (t6). With the signal PRO2 at "H" (t7), and the signal SEN2 at "H" (t8), the clock synchronous inverter CI3 is activated and the voltage of the bitline BLi is sensed. With the signal LAT2 at "H" (t9), the clock synchronous inverter CI4 is activated and the logic level of the sensed signal of the bitline BLi is latched. With the signal PRO2 at "L" (t10), the detection on whether or not the memory cell corresponding to the data memory circuit 10 storing the control data "3" has reached the state of storing the "3" data (verify read of the data "3") is completed. At the time, only when the memory cell corresponding to the data memory circuit 10 storing the "3" control data is detected to have reached the state of storing the "3" data, the control data of the data memory circuit 10 storing the "3" control data are changed to the "0" data. In the other cases, the control data are retained (not changed).

The operation for detecting whether or not the memory cell corresponding to the data memory circuit 10 storing the control data of "2" reaches the state of storing the "2" data is executed. With the voltage VBL1 at 1.3 V (t10), and the signal PRE1 at "H", the bitline BLi is charged to "H" (t11). With the signal PRE1 at "L", the bitline BLi and the voltage VBL1 are disconnected. The select gates SG1 and SG2 of the selected block and the non-selected word lines WL1, WL3, WL4 are set at the power supply voltage VCC, and the selected word line WL2 is set at 1.2 V (t12). At the same time the signal VRFY1 is set at 1.3 V, the n-channel MOS transistor Qn34 is executed. Accordingly, only when the first sub-data are "0", the potential of the bitline BLi is set at "L" by the n-channel MOS transistors Qn34, Qn35 (t12 to t13).

With the selected word line WL2 at 1.2 V, if the memory cell corresponding to the data memory circuit 10 storing the control data of "2" reaches the state of storing the "2" data, the bitline BLi remains at "H". If the memory cell corresponding to the data memory circuit 10 storing the control data of "2" does not reach the state of storing the "2" data, the bitline BLi becomes "L". Since the memory cell corresponding to the data memory circuit 10 storing the control data of "1" does not reach the state of storing the "2" data, the bitline BLi becomes "L". After the select gates SG1 and SG2, and the word lines WL1 to WL4 are reset at 0 V (t13), only when the signal VRFY2 becomes "H" and the second sub-data are "0", the bitline BLi is set at "H" (t14). Here the voltage VREG is VCC. With the signals SEN2 and LAT2 at "L", the clock synchronous inverters CI3 and CI4 are deactivated (t16). With the signal PRO2 at "H" (t17), and the signal SEN2 at "H" (t18), the clock synchronous inverter CI3 is activated and the voltage of the bitline BLi is sensed. With the signal LAT2 at "H" (t19), the clock synchronous inverter CI4 is activated, and the logic level of the sensed signal of the bitline BLi is latched. With the signal PRO2 at "L" (t20), the detection of whether or not the memory cell corresponding to the data memory circuit 10 storing the control data of "2" reaches the state of storing the "2" data (verify read of the data "2") is completed.

At the time, if the memory cell corresponding to the data memory circuit 10 storing the control data of "3" has reaches the state of storing the "3" data, the control data of the data memory circuit 10 are changed to the "0" data. Only when the memory cell corresponding to the data memory circuit 10 storing the control data of "2" reaches the state of storing the "2" data, the control data of the data memory circuit 10 are changed to the "1" data. In the other cases, the control data are retained (not changed).

The operation for detecting whether or not the memory cell corresponding to the data memory circuit 10 storing the control data of "1" has reaches the state of storing the "1" data is executed. With the voltage VBL1 at 1.3 V (t20), and the signal PRE1 at "H", the bitline BLi is charged to "H" (t21). With the signal PRE1 at "L", the bitline BLi and the voltage VBL1 are disconnected. The select gates SG1 and SG2 of the selected block and the non-selected word lines WL1, WL3, WL4 are set at the power supply voltage VCC, and the selected word line WL2 is set at 0.4 V (t22).

With the selected word line WL2 at 0.4 V, if the memory cell corresponding to the data memory circuit 10 storing the control data of "1" reached the state of storing the "1" data, the bitline BLi remains at "H". If the memory cell corresponding to the data memory circuit 10 storing the control data of "1" does not reach the state of storing the "1" data, the bitline BLi becomes "L". After the select gates SG1 and SG2, and the word lines WL1 to WL4 are reset at 0 V (t23), when the signal PRO2 becomes 1.3 V (t24), and the second sub-data are "1", the bitline BLi is set at "L". In the case the second sub-data are "0" 1 and the bitline BLi is originally "H", the bitline BLi remains at "H". In the case the second sub-data are "0" and the bitline BLi is originally "L", the bitline BLi can reach only 0.3 V at most by the signal PRO2 of 1.3 V with the threshold voltage of the n-channel MOS transistor Qn40 of 1 V. If the clock synchronous inverter CI1 is set such that the voltage of the bitline BLi of 0.3 V is detected to be "L", the bitline BLi remains at "L". Only when the signal VRFY1 becomes "H", and the first sub-data are "0", the bit line BLi is changed to "H" (t26). With the signals SEN1 and LAT1 at "L", the clock synchronous inverters CI1 and CI2 are deactivated (t28). With the signals SEN1 and LAT1 at "L", the clock synchronous inverters CI1 and CI2 are deactivated (t28). With the signal PRO1 at "H" (t29), and the signal SEN1 at "H" (t30), the clock synchronous inverter CI1 is activated so that the voltage of the bitline BLi is sensed. With the signal LAT1 at "H" (t31), the clock synchronous inverter CI2 is activated and the logic level of the signal of the bitline BLi is latched. With the signal PRO1 at "L" (t32), the detection of whether or not the memory cell corresponding to the data memory circuit 10 storing the control data of "1" has reached the state of storing the "1" data (verify read of the data "1") is completed. At the time, only when the memory cell corresponding to the data memory circuit 10 storing the control data of "3" has reached the state of storing the "3" data, the memory cell corresponding to the data memory circuit 10 storing the control data of "2" has reached the state of storing the "2" data, and the memory cell corresponding to the data memory circuit 10 storing the control data of "1" has reached the state of storing the "1" data, the control data of the data memory circuit 10 are changed to the "0" data. In the other cases, the control data are retained (not changed).

With the signal BCL1 at "L", the signal PRE1 at "H", and the voltage VFF at VCC, the programming verification operation is completed.

By the programming verification operation, the control data stored in the data memory circuit 10 are changed by the programming state of the memory cell as shown in Table 8.

TABLE 8

| Memory cell programming state | Control data before programming verification | Control data after programming verification |
| --- | --- | --- |
| 0, 1, 2 or 3 | 0 | 0 |
| not reached 1 | 1 | 1 |
| 1 | 1 | 0 |
| not reached 2 | 2 | 2 |
| 2 | 2 | 0 |
| not reached 3 | 3 | 3 |
| 3 | 3 | 0 |

Accordingly, by repeating the programming operation shown in t1 to t9 of FIG. 17 and the programming verification operation shown in FIGS. 18A to 18C until all the control data become "0", the data programming (program) to the memory cell M can be executed. However, preferably as described in the above-mentioned first embodiment, the verify read of the data "3", the verify read of the data "2", and the verify read of the data "1" are executed selectively as mentioned below.

(1) In order to execute all of the verify read of the data "3", the verify read of the data "2", and the verify read of the data "1", the procedure shown in FIGS. 18A to 18C can be executed.

(2) In order to execute only the verify read of the data "3" and the verify read of the data "2", the procedure shown in FIGS. 18A to 18C can be executed.

(3) In order to execute only the verify read of the data "3" and the verify read of the data "1", only time t11 to t21 can be omitted from the procedure shown in FIGS. 18A to 18C.

(4) In order to execute only the verify read of the data "3", time t11 to t34 can be omitted from the procedure shown in FIGS. 18A to 18C. However, at t11, the voltage VBL1 is reset at 0 V, VFF at VCC, the signal PRE1 at "H", and BCL1 at "L".

(5) In order to execute only the verify read of the data "2" and the verify read of the data "1", time t1 to t11 can be omitted from the procedure shown in FIGS. 18A to 18C. However, at t11, the voltage VBL1 is set at 1.3 V, VFF at 2.0 V, and BCL1 at "H".

(6) In order to execute only the verify read of the data "2", time t1 to t11 can be omitted from the procedure shown in FIGS. 18A to 18C. However, at t11, the voltage VBL1 is set at 1.3 V, VFF at 2.0 V, and BCL1 at "H".

(7) In order to execute only the verify read of the data "1", time t1 to t21 can be omitted from the procedure shown in FIGS. 18A to 18C. However, at t11, the voltage VBL1 is set at 1.3 V, VFF at 2.0 V, and BCL1 at "H".

Here in the programming verification operation in the second embodiment of the present invention, in executing the verify read of the data "2", only the second sub-data circuit 21 senses the bitline potential. That is, if the sense sensitivities of the first sub-data circuit 20 and the second sub-data circuit 21 comprising the data memory circuit 10 are not identical, in the case the memory cell reaches the state of storing the "2" data, it is possible that the control data are change, for example, from "2" to "3" even if the use tries to change the control data of the data memory circuit 10 from "2" to "0" by using both two sub-data circuits. Therefore, it is possible that the memory cell to which the data "2" are desired to be programmed, may be programmed with the data "3".

In order to prevent such problems, in the second embodiment of the present invention, in the verify read of the data "2" among the programming verification operations, only the second sub-data circuit 21 senses the bit line potential. In the case the memory cell reaches the state of storing the "2" data, the control data of the data memory circuit 10 are changed from "2" to "1" at the time of the verify read. If the verify read of the data "1" is executed after the verify read of such data "2", the originally changed control data from "2" to "1" always become "0". That is, the control data of the data memory circuit 10 can be converted correctly so that stable programming verification results can be obtained.

Figure 19:
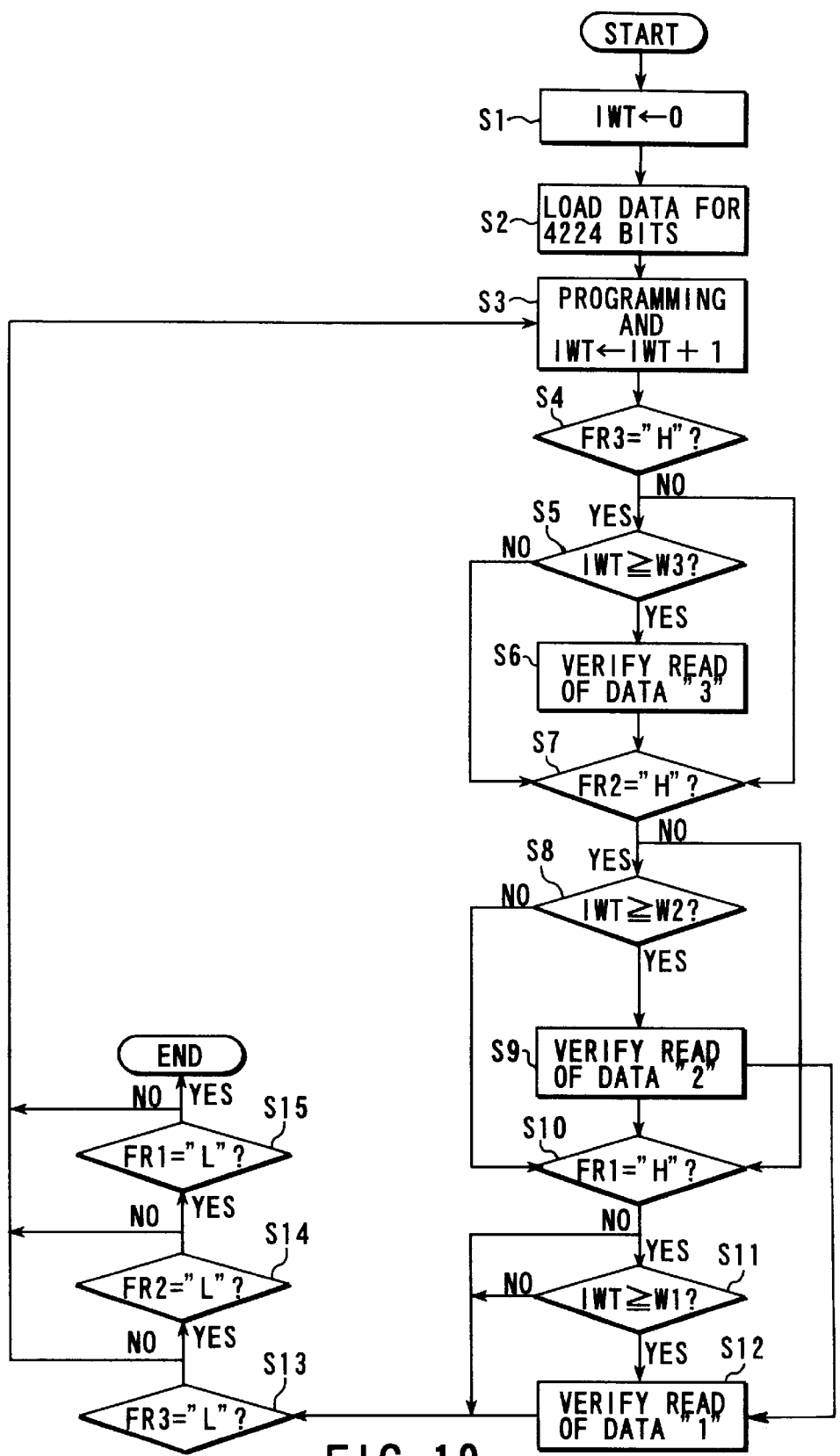
FIG. 19 is a flow chart showing the program flow of multi-level memory in the second embodiment of the present invention.

FIG. 19 shows the detailed flow of the program with respect to the multi-level memory in the second embodiment of the present invention. The program flow is controlled by the control signal and control voltage generating circuit 7 shown in FIG. 1. Here unlike the program flow shown in FIG. 10, when the verify read of the data "2" is started, the verify read of the data "1" is set to be always executed.

By the command of starting the program inputted in the control signal inputting terminal 8, the program is started. The counter circuit for counting the variable IWT provided in the control signal and control voltage generating circuit 7 is reset to have IWT at 0 (S1). The initial control data for 4224 bits inputted to the data input/output terminal 5 are loaded to the data memory circuit (S2).

After loading the data, the programming operation is executed with the variable IWT is incremented by 1 (S3). Whether or not the output FR3 of the data detection circuit 9 is "H" is checked (S4). If the output FR3 of the data detection circuit 9 is "H" and the data "3" remain in the data memory circuit 10, whether or not the variable IWT is not less than the predetermined W3 can be checked (S5). If the variable IWT is not less than W3, the verify read of the data "3" is executed (S6). If the FR3 is at "L" or the variable IWT is less than W3, the verify read of the data "3" is omitted.

Whether or not the output FR2 of the data detection circuit 9 is "H" is checked (S7). If the output FR2 of the data detection circuit 9 is "H" and the data "2" remain in the data memory circuit 10, whether or not the variable IWT is not less than the predetermined W2 can be checked (S8). If the variable IWT is not less than W2, the verify read of the data "2" is executed (S9). If the FR2 is at "L" or the variable IWT is less than W2, the verify read of the data "2" is omitted.

Whether or not the output FR1 of the data detection circuit 9 is "H" is checked (S10). If the output FR1 of the data detection circuit 9 is "H" and the data "1" remain in the data memory circuit 10, whether or not the variable IWT is not less than the predetermined W1 can be checked (S11). If the variable IWT is not less than W1, the verify read of the data "1" is executed (S12). If the FR1 is at "L" or the variable IWT is less than W1, the verify read of the data "1" is omitted. However, in the case the verify read of the data "2" (S9) is executed, the verify read of the data "1" is always executed (S12).

If all the outputs FR3, FR2, FR1 of the data detection circuit 9 are "L", the program is completed (S13, S14, S15). If even one of the outputs FR3, FR2, FR1 is "H", the programming operation is executed again (S3). Each time the variable IWT increments by 1, the voltage applied to the selected word line at the time of programming (the voltage of the selected word line in the time t3 to t7 shown in FIG. 16B) is increased by 0.4 V, and the threshold voltage of the memory cell M for the "1", "2", "3" programming is raised by 0.4 V. The predetermined W1, W2, W3 are determined as mentioned below.

Again with reference to FIG. 11, explanation is provided. FIG. 11 shows an example of the programming character-istic of the memory cell. The horizontal axis represents the programming operation number IWT. The vertical axis represents the threshold voltages of the easiest memory cell to be programmed (white dot) and the hardest memory cell to be programmed (black dot) after the programming operation number IWT. The threshold voltage of the easiest programmed memory cell reaches 0.1 V after the first programming operation. At the time, the threshold voltage of the hardest programmed memory cell is −1.5 V. Since each time the programming operation number increases by 1, the voltage of the selected word line at the time of programming is increased by 0.4 V, the threshold voltage of the memory cell is raised substantially by 0.4 V accordingly. However, the threshold voltage of the memory cell M connected to the data memory circuit 10 storing the control data of "1" is lower by 0.8 V.

Since neither of the threshold voltages of the memory cells reaches 0.4 V in the initial programming operation, all the verify read for the data "3", the data "2", and the data "1" is not required. From the fourth time and later, since the threshold voltage of the easiest programmed memory cell exceeds 1.2 V, the verify read of the data "2" is necessary. Since the threshold voltage of the memory cell M connected to the data memory circuit 10 storing the control data of "1" exceeds 0.4 V, the verify read of the data "1" becomes also necessary. Therefore, the W1, W2 can be preliminarily determined as 4. From the sixth time and later, since the threshold voltage of the easiest programmed memory cell exceeds 2.0 V, the verify read of the data "3" is necessary. Therefore, the W3 can be preliminarily determined as 6.

After the ninth time programming operation, that is, IWT=9 or later, the outputs FR1 and FR2 of the data detection circuit become "L". After the tenth time programming operation, even the threshold voltage of the hardest programmed memory cell exceeds 0.4 V. Therefore, the output FR3 of the data detection circuit becomes "L" at least from IWT=11 or later.

Figure 20:
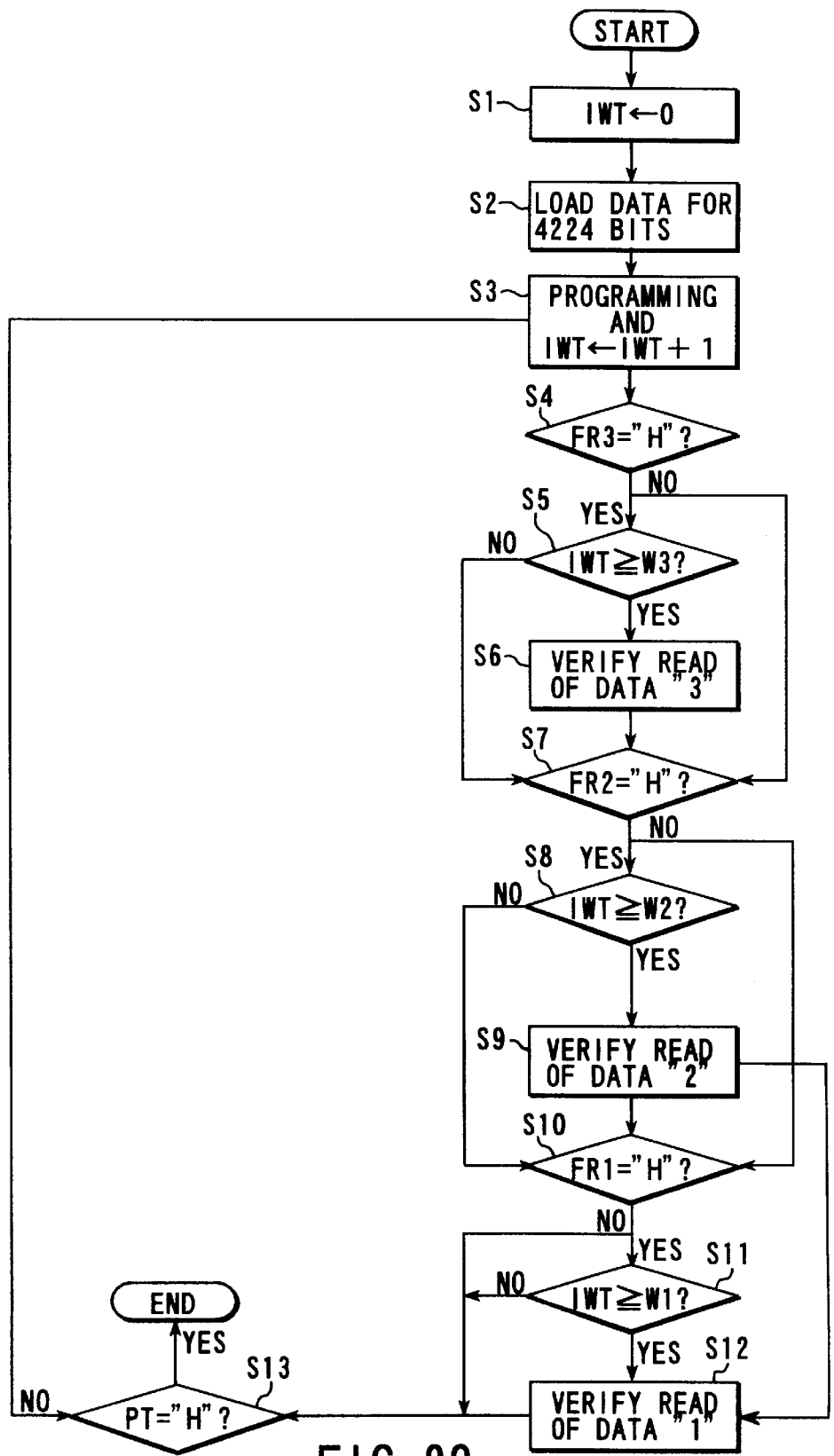
FIG. 20 is a flow chart showing a modification of the program flow of multi-level memory in the second embodiment of the present invention.

FIG. 20 shows the program flow in the case the data detection circuit 9 shown in FIG. 12 is used. The steps S4, S7, S10 can be executed with the signals DEC3B, DEC2B, DEC1B at "L", respectively and checking the signals FR3, FR2, FR1. The step S13 can be executed with the signal DECB at "L" and checking the signal PT. In the other cases, the program is executed in the same flow as shown in FIG. 19.

In the second embodiment of the present invention, it is possible to execute the data programming by repeating the programming operation shown in time t1 to t9 of FIG. 17 and the programming verification operation shown in FIGS. 18A to 18C until all the control data become "0". In this case, it is possible to use one with the circuit configuration shown in FIG. 21 as the data detection circuit 9 shown in FIG. 1.

Figure 21:
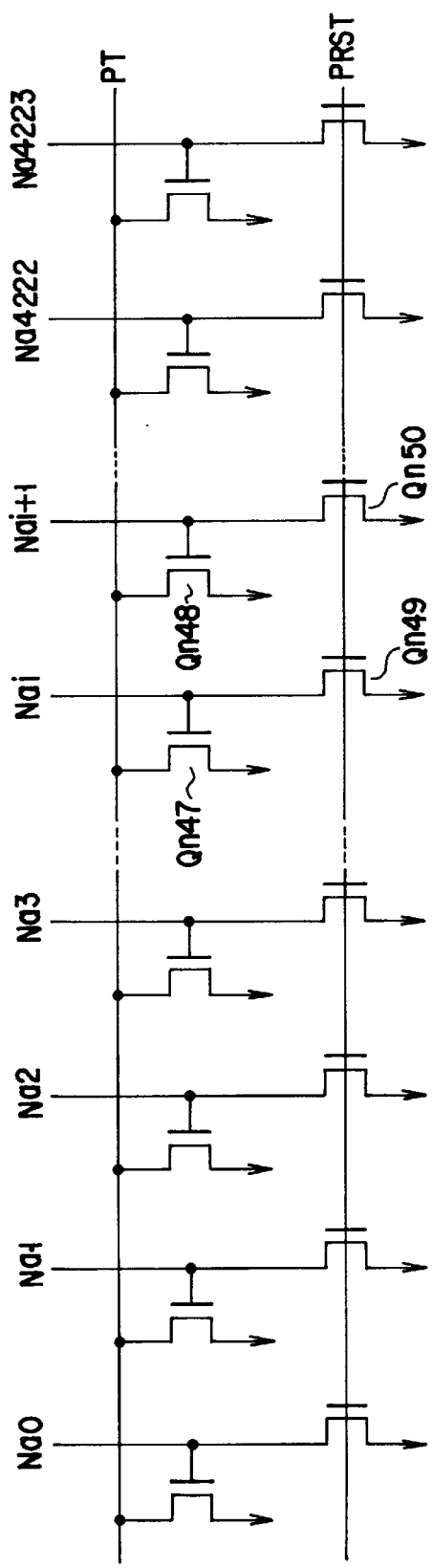
FIG. 21 is a chart showing a modification of the data detection circuit shown in FIG. 1.

In the data detection circuit shown in FIG. 21, to the node Nai in the first sub-data circuit 20, the gate electrode of the n-channel MOS transistor Qn47 and one end of the current path of the n-channel MOS transistor Qn49 are connected. To the node Nai+1 in the second sub-data circuit 21, the gate electrode of the n-channel MOS transistor Qn48 and one end of the current path of the n-channel MOS transistor Qn50 are connected. The n-channel MOS transistors Qn47, Qn48 are circuits for detecting whether or not all the sub-data circuits store the sub-data of "0". In the case all the sub-data circuits store the sub-data of "0", the signal line PT and the ground level become not executed, and if even one of the 4224 pieces of the sub-data circuits stores the sub-data of "1", the signal line PT and the ground level become executed. The n-channel MOS transistors Qn49, Qn50 are for storing the sub-data of "0" in all the sub-data circuits. With the signal PRST at "H", the sub-data of "0" are set in all of the 4224 pieces of the sub-data circuits.

As for the circuit configuration of the data memory circuit, one with the first embodiment shown in FIG. 5 can be easily realized. On the contrary, in the first embodiment, one with the data memory circuit using the clock synchronous inverter shown in FIG. 14 as the sense amplifier can be easily realized.

As heretofore mentioned, a multi-level memory according to the first aspect of the present invention, comprises an electrically programmable memory cell (M) having at least an erased state, a first programming state and a second programming state, and programming circuits (2, 3, 6, 7, 9) for programming data by repeating a programming operation for a certain program by applying a programming voltage to the memory cell (M), a first programming verification operation for confirming whether or not the memory cell (M) has reached the first programming state after the programming operation, or a second programming verification operation for confirming whether or not the memory cell (M) has reached the second programming state after the programming operation, wherein the programming circuit (2, 3, 6, 7, 9) repeat the programming operation and the first programming verification operation while omitting the second programming verification operation in the first period of the data programming, and repeats the programming operation, the first programming verification operation and the second programming verification operation in the second period after the first period of the data programming.

As further preferable embodiments, the below-mentioned can be presented.

(1) The programming circuits (2, 3, 6, 7, 9) repeat the programming operation and the second programming verification operation while omitting the first programming verification operation in the third period after the second period.

(2) The programming circuit (2, 3, 6, 7, 9) change the programming voltage to be applied to the memory cell (M) when the memory cell (M) is confirmed to have reached the first programming state or the second programming state.

A multi-level memory according to the first aspect of the present invention comprises a plurality of electrically programmable memory cells (M) having at least an erased state, a first programming state and a second programming state, and programming circuits (2, 3, 6, 7, 9) for programming data by repeating a programming operation for a certain program by applying a programming voltage to the plurality of the memory cells (M), a first programming verification operation for confirming whether or not the memory cell (M) to be in the first programming state has reached the first programming state among the plurality of the memory cells (M) after the programming operation, or a second programming verification operation for confirming whether or not the memory cell (M) to be in the second programming state among the plurality of the memory cells (M) has reached the second programming state after the programming operation, wherein the programming circuits (2, 3, 6, 7, 9) repeat the programming operation and the first programming verification operation while omitting the second programming verification operation in the first period of the data programming, and repeat the programming operation, the first programming verification operation and the second programming verification operation in the second period after the first period of the data programming.

As further preferable embodiments, the below-mentioned can be presented.

(1) The programming circuits (2, 3, 6, 7, 9) repeat the programming operation and the second programming verification operation while omitting the first programming verification operation in the third period after the second period.

(2) The programming circuits (2, 3, 6, 7, change the programming voltage to be applied to the memory cell (M) to be in the first programming state when the memory cell (M) to be in the first programming state is confirmed to have reached the first programming state, and change the programming voltage to be applied to the memory cell (M) to be in the second programming state when the memory cell (M) to be in the second programming state is confirmed to have reached the second programming state.

(3) The first period is preliminarily determined.

(4) The programming circuits (2, 3, 6, 7, 9) repeat the programming operation and the second programming verification operation while omitting the first programming verification operation when all of the memory cells (M) to be in the first programming state are confirmed to have reached the first programming state.

(5) The programming circuits (2, 3, 6, 7, 9) detect whether or not all of the memory cells (M) to be in the first programming state have reached the first programming state simultaneously.

(6) The programming circuits (2, 3, 6, 7, 9) detect whether or not all of the memory cells (M) to be in the second programming state have reached the second programming state simultaneously.

(7) The programming voltage to be applied to the memory cell (M) to be in the first programming state and the programming voltage to be applied to the memory cell (M) to be in the second programming state are equal.

(8) The programming circuits (2, 3, 6, 7, 9) complete the programming operation after confirming that all of the memory cells (M) applied with programming have reached a desired programming state.

(9) The programming circuits (2, 3, 6, 7, 9) detect that all of the memory cells (M) applied with programming have reached a desired programming state simultaneously.

A multi-level memory according to the second aspect of the present invention comprises a memory cell array (1) comprising a plurality of nonvolatile memory cells (M) each of which can store data of an n value (n≧3), and data memory circuits (10) for storing control data for determining a programming control voltage to be applied to a selected memory cell (M) in the memory cell array (1) in the programming operation, wherein the data memory circuits (10) apply the programming control voltage to the selected memory cell (M) based on the control data stored in the data memory circuits (10), the data memory circuits (10) storing first control data detect whether or not the selected memory cell (M) reached the first state from the programming state and when it has reached, the control data are changed to second control data, the data memory circuits (10) storing the second control data detect whether or not the selected memory cell (M) reached the second state and when it has reached, the control data are changed to third control data.

As further preferable embodiments, the below-mentioned can be presented.

(1) The first state has a first threshold voltage level, and the second state has a second threshold level, which is lower than the first threshold voltage level.

(2) The data memory circuits (10) comprise first sub-data circuits (CI1, CI2, Qn33, Qn34, Qn35) and second sub-data circuits (CI3, CI4, Qn40, Qn41, Qn42), wherein the first sub-data circuits (CI1, CI2, Qn33, Qn34, Qn35) store sub-data of a first logic level and the second sub-data circuits (CI3, CI4, Qn40, Qn41, Qn42) store sub-data of a first logic level for storing the first control data, the first sub-data circuits (CI1, CI2, Qn33, Qn34, Qn35) store sub-data of a first logic level and the second sub-data circuits (CI3, CI4, Qn40, Qn41, Qn42) store sub-data of a second logic level for storing the second control data, and the first sub-data circuits (CI1, CI2, Qn33, Qn34, Qn35) store sub-data of the second logic level and the second sub-data circuits (CI3, CI4, Qn40, Qn41, Qn42) store sub-data of the second logic level for storing the third control data.

(3) The data memory circuits (10) detect whether or not the programming state of the selected memory cell (M) reached the first state by one of the first and second sub-data circuits, and whether or not the programming state of the selected memory cell (M) reached the second state by the other one of the first and second sub-data circuits.

(4) A circuit for simultaneously detecting whether or not all the sub-data stored in the first and second sub-data circuits comprising all the data memory circuits (10) are at the second logic level is further provided.

(5) The memory cell (M) can store four-levels, and the first and second sub-data circuits include one flip-flop circuit each.

(6) The memory cell (M) can store triplicate values, and the first and second sub-data circuits include one flip-flop circuit each.

The present invention is not limited to the first and second embodiments mentioned above. For example, the present invention can be realized also in a multi-level memory nonvolatile semiconductor memory device having NOR type memory cell array or a hot electron charging programming type multi-level memory non-volatile semiconductor memory device. Other changes and modifications can be adopted within the range not parting from the essential elements of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A multi-level memory comprising:
    an electrically programmable memory cell having at least an erased state, a first programming state and a second programming state, and
    a programming circuit for programming data by repeating a programming operation by applying a programming voltage to said memory cell, a first programming verification operation for confirming whether said memory cell has reached said first programming state after said programming operation, or a second programming verification operation for confirming whether said memory cell has reached the second programming state after said programming operation,
    wherein said programming circuit repeats said programming operation and said first programming verification operation except for said second programming verification operation in a first period of data programming, and repeats said programming operation, said first programming verification operation and said second programming verification operation in a second period after the first period of data programming.

2. The multi-level memory according to claim 1, wherein said programming circuit changes the programming voltage to be applied to said memory cell when said memory cell is confirmed to have reached a predetermined programming state.

3. The multi-level memory according to claim 1, wherein said programming circuit repeats said programming operation and said second programming verification operation except for said first programming operation in a third period after said second period.

4. The multi-level memory according to claim 3, wherein said programming circuit changes the programming voltage to be applied to said memory cell when said memory cell is confirmed to have reached a predetermined programming state.

5. A multi-level memory comprising:
    a plurality of electrically programmable memory cells each having at least an erased state, a first programming state and a second programming state, and
    a programming circuit for programming data by repeating a programming operation by applying a programming voltage to said plurality of memory cells at the same time, and at least one programming verification operation selected from the group consisting of a first programming verification operation for confirming whether the memory cell to be in the first programming state among said plurality of memory cells has reached the first programming state after said programming operation and a second programming verification operation for confirming whether the memory cell to be in the second programming state among said plurality of memory cells has reached said second programming state after said programming operation,
    wherein said programming circuit repeats said programming operation and said first programming verification operation except for said second programming verification operation in a first period of data programming, and repeats said programming operation, said first programming verification operation and said second programming verification operation in a second period after the first period of data programming.

6. The multi-level memory according to claim 5, wherein said programming circuit changes the programming voltage to be applied to the memory cell to be in said first programming state when said memory cell to be in the first programming state is confirmed to have reached said first programming state, and changes the programming voltage to be applied to the memory cell to be in said second programming state when said memory cell to be in said second programming state is confirmed to have reached said second programming state.

7. The multi-level memory according to claim 5, wherein the first period is preliminarily determined.

8. The multi-level memory according to claim 5, wherein said programming circuit applies an equal programming voltage to the memory cell to be in said first programming state and to the memory cell to be in said second programming state.

9. The multi-level memory according to claim 5, wherein said programming circuit completes said programming operation after confirming that all of the memory cells applied with programming have reached a desired programming state.

10. The multi-level memory according to claim 9, wherein said programming circuit simultaneously detects that all of the memory cells applied with programming have reached the desired programming state.

11. The multi-level memory according to claim 5, wherein said programming circuit repeats said programming operation and said second programming verification operation except for said first programming operation in a third period after said second period.

12. The multi-level memory according to claim 11, wherein said programming circuit changes the programming voltage to be applied to the memory cell to be in said first programming state when said memory cell to be in the first programming state is confirmed to have reached said first programming state, and changes the programming voltage to be applied to the memory cell to be in said second programming state when said memory cell to be in said second programming state is confirmed to have reached said second programming state.

13. The multi-level memory according to claim 11, wherein the first period is preliminarily determined.

14. The multi-level memory according to claim 11, wherein said programming circuit repeats said programming operation and the second programming verification operation except for said first programming operation when all of the memory cells to be in said first programming state are confirmed to have reached said first programming state.

15. The multi-level memory according to claim 14, wherein said programming circuit simultaneously detects whether all of the memory cells to be in said first programming state have reached said first programming state.

16. The multi-level memory according to claim 14, wherein said programming circuit simultaneously detects whether all of the memory cells to be in the second programming state have reached the second programming state.

17. A multi-level memory comprising:
a memory cell array comprising a plurality of nonvolatile memory cells each for storing data of an n value (n≧3), and
data memory circuits for storing control data for determining a programming control voltage to be applied to a selected memory cell in said memory cell array in a programming operation, wherein said data memory circuits apply the programming control voltage to the selected memory cell based on the control data stored in the data memory circuits,
said data memory circuits storing first control data and detecting whether the selected memory cell has reached a first state and changing the control data to second control data when the selected memory cell has reached the first state,
the data memory circuits storing said second control data and detecting whether the selected memory cell has reached a second state and changing the control data to third control data when the selected memory cell has the second state.

18. The multi-level memory according to claim 17, wherein said first state has a first threshold voltage level, and said second state has a second threshold level, which is lower than the first threshold voltage level.

19. The multi-level memory according to claim 17, wherein said data memory circuits comprise first sub-data circuits and second sub-data circuits, wherein said first sub-data circuits store sub-data of a first logic level and said second sub-data circuits store sub-data of a first logic level for storing said first control data, said first sub-data circuits store sub-data of a first logic level and said second sub-data circuits store sub-data of a second logic level for storing said second control data, and said first sub-data circuits store sub-data of said second logic level and said second sub-data circuits store sub-data of said second logic level for storing said third control data.

20. The multi-level memory according to claim 19, wherein one of the first and second sub-data circuits of each of said data memory circuits detects whether a programming state of the selected memory cell has reached the first state, and the other one of the first and second sub-data circuits of each of said data memory circuits detects whether the programming state of the selected memory cell has reached the second state.

21. The multi-level memory according to claim 19, further comprising a circuit for simultaneously detecting whether all the sub-data stored in the first and second sub-data circuits of the data memory circuits are at said second logic level.

22. The multi-level memory according to claim 19, wherein said memory cell stores four-levels, and each of said first and second sub-data circuits includes a flip-flop circuit.

23. The multi-level memory according to claim 19, wherein said memory cell stores three-levels, and each of said first and said second sub-data circuits includes a flip-flop circuit.

24. A multi-level memory comprising:
a memory cell array comprising a plurality of nonvolatile memory cells each for storing data of an n value (n≧3), and
data memory circuits for storing control data for determining programming control voltages to be applied to respective ones of the memory cells in said memory cell array in a programming operation, wherein
said data memory circuits apply the programming control voltages to the respective ones of the memory cells based on the control data stored in the data memory circuits in the programming operation,
said data memory circuits storing first control data and detecting whether corresponding memory cells have reached a first state in a first programming verify operation, the first control data stored in the data memory circuits corresponding to the memory cells which have reached the first state being modified to second control data,
said data memory circuits storing the second control data and detecting whether corresponding memory cells have reached a second state in a second programming verify operation, the second control data stored in the data memory circuits corresponding to the memory cells which have reached the second state being modified to third control data, and
said programming operation, said first programming verify operation and said second programming verify operation are repeated.

25. The multi-level memory according to claim 24, wherein the first state has a first threshold level, and the second state has a second threshold level, which is lower than the first threshold voltage level.

26. The multi-level memory according to claim 24, wherein each of said data memory circuits comprises a first sub-data circuit and a second sub-data circuit, wherein said first sub-data circuit stores sub-data of a first logic level and said second sub-data circuit stores sub-data of the first logic level for storing the first control data, said first sub-data circuit stores sub-data of the first logic level and said second sub-data circuit stores sub-data of a second logic level for storing the second control data, and said first sub-data circuit stores sub-data of the second logic level and said second sub-data circuit stores sub-data of the second logic level for storing the third control data.

27. The multi-level memory according to claim 26, wherein said second sub-data circuit of each of said data memory circuits detects whether a programming state of a corresponding memory cell has reached the first state, and said first sub-data circuit of each of said data memory circuits detects whether the programming state of a corresponding memory cell has reached the second state.

28. The multi-level memory according to claim 26, further comprising a circuit for simultaneously detecting whether all the sub-data stored in the first and second sub-data circuits of all the data memory circuits are at the second logic level.

29. The multi-level memory according to claim 26, wherein said memory cells store four-levels, and each of said first and second sub-data circuits includes a flip-flop circuit.

30. The multi-level memory according to claim 26, wherein said memory cells store three-levels, and each of said first and said second sub-data circuits includes a flip-flop circuit.

* * * * *